United States Patent [19]
Yasu et al.

[11] Patent Number: 5,912,849
[45] Date of Patent: Jun. 15, 1999

[54] WRITE PROTECTION FOR A NON-VOLATILE MEMORY

[75] Inventors: Yoshihiko Yasu; Hiroyuki Sakai, both of Tokyo, Japan; Michael W. Yeager; Donald J. Verhaeghe, both of Colorado Springs, Colo.

[73] Assignees: Hitachi, Ltd., Tokyo, Japan; Ramtron International Corporation, Colorado Springs, Colo.

[21] Appl. No.: 09/141,564

[22] Filed: Aug. 28, 1998

Related U.S. Application Data

[63] Continuation of application No. 08/723,367, Sep. 30, 1996, Pat. No. 5,818,771.

[51] Int. Cl.⁶ ............................................. G11C 7/00
[52] U.S. Cl. ........................................ 365/195; 365/145
[58] Field of Search ................................ 365/195, 145, 365/196, 230.03, 189.07

[56] References Cited

U.S. PATENT DOCUMENTS

| | | | |
|---|---|---|---|
| 5,363,334 | 11/1994 | Alexander et al. | 365/195 |
| 5,396,471 | 3/1995 | Kitsu | 365/195 |
| 5,467,081 | 11/1995 | Drews et al. | 365/195 |
| 5,488,587 | 1/1996 | Fukumoto | 365/222 |
| 5,513,136 | 4/1996 | Fandrich et al. | 365/185.04 |
| 5,668,760 | 9/1997 | Hazen | 365/195 |
| 5,802,583 | 9/1998 | Yeager et al. | 365/195 X |

*Primary Examiner*—Son Mai
*Attorney, Agent, or Firm*—Antonelli, Terry, Stout & Kraus, LLP

[57] ABSTRACT

A semiconductor memory device, divided into plural blocks, comprising: a memory array having a non-volatile memory element which makes the read cycle and the write cycle to be substantially equivalent; plural storage elements storing the information of write protection/permission corresponding to each said block respectively; and a setting circuit to set the information of write protection/permission to said plural storage elements, wherein said setting circuit sets the write-protection information to said plural storage elements at the write cycle after designated plural read cycles. Therefore, the write protection/permission can be set by the unit of block, block by block, so that the write-protected ROM and the RAM can be set freely. Furthermore, the complexity of the setting procedure of write protection/permission may prevent the accidental false setting caused by a system runaway and so forth.

10 Claims, 16 Drawing Sheets

Pin Arrangement (Top View)

Fig.8

| Cycle | Disable Sequece | Enable Sequence | Mode |
|---|---|---|---|
| 1 | 1823 Hex | 1823 Hex | Read |
| 2 | 1820 Hex | 1820 Hex | Read |
| 3 | 1822 Hex | 1822 Hex | Read |
| 4 | 0418 Hex | 0418 Hex | Read |
| 5 | 041B Hex | 041B Hex | Read |
| 6 | 0419 Hex | 0419 Hex | Read |
| 7 | 041A Hex | 040A Hex | Read |

Fig.9

| Cycle | Sequence | I/O | Mode |
|---|---|---|---|
| 1 | 1823 Hex | Data | Read |
| 2 | 1820 Hex | Data | Read |
| 3 | 1822 Hex | Data | Read |
| 4 | 0418 Hex | Data | Read |
| 5 | 041B Hex | Data | Read |
| 6 | 0419 Hex | Data | Read |
| 7 | 041A Hex | Data | Read |
| 8 | 040F Hex | New block protect data | Write |

Fig.10

| Cycle | Sequence | I/O | Mode |
|---|---|---|---|
| 1 | 1823 Hex | Data | Read |
| 2 | 1820 Hex | Data | Read |
| 3 | 1822 Hex | Data | Read |
| 4 | 0418 Hex | Data | Read |
| 5 | 041B Hex | Data | Read |
| 6 | 0419 Hex | Data | Read |
| 7 | 041A Hex | Data | Read |
| 8 | 040F Hex | Restore block protect data | Read |

Fig.11

| 4K Block Number | A14 | A13 | A12 | I/O# |
|---|---|---|---|---|
| 0 | 0 | 0 | 0 | 0 |
| 1 | 0 | 0 | 1 | 1 |
| 2 | 0 | 1 | 0 | 2 |
| 3 | 0 | 1 | 1 | 3 |
| 4 | 1 | 0 | 0 | 4 |
| 5 | 1 | 0 | 1 | 5 |
| 6 | 1 | 1 | 0 | 6 |
| 7 | 1 | 1 | 1 | 7 |

| I/O No. | 7 | 6 | 5 | 4 | 3 | 2 | 1 | 0 |
|---|---|---|---|---|---|---|---|---|
|  | 1 | 0 | 0 | 0 | 0 | 0 | 1 | 1 |

WRITE PROTECTION FOR A NON-VOLATILE MEMORY

CROSS-REFERENCE TO RELATED APPLICATION

This application is a continuation of application Ser. No. 08/723,367, filed on Sep. 30, 1996, U.S. Pat. No. 5,818,771, the entire disclosure of which is hereby incorporated by reference.

BACKGROUND OF THE INVENTION

This invention relates to semiconductor memory devices, and in particular, to non-volatile electrically reloadable or rewritable semiconductor memory devices. The present invention also particularly relates to a write-protection arrangement for such a memory device, and especially to write-protection for ferroelectric memory elements.

LSIs (Large Scale Integrated circuits) such as microprocessors and memories for portable information apparatus such as PDAs (Personal Digital Assistants) are expected to work more effectively with lower power. For the PDA memory, both a ROM (Read Only Memory) and a RAM (Randon-Access Memory) are necessary. The ROM is used to store an OS (Operating System) and application software while the RAM is used to store such rewritable or reloadable data as display data and personal data. As such, the RAM is used as a work memory for processing. PDAs also typically include a reloadable ROM such as flash memory card to store a large quantity of data which exceed RAM capacity and cannot be stored in the RAM. The RAM is typcially battery-protected (with a battery backup) so that the data will not be erased when the power is turned off and on. A resume function may be achieved so the previous state (where turned off) of the microprocessor can be restored when turning the power on.

On the other hand, ferroelectric memories have recently been developed which are characterized by having an operating speed equivalent to a RAM plus the added advantage of non-volatility. Therefore, it has been considered to substitute ferroelectric memories for DRAMs (Dynamic RAM) in portable information devices. Related matters are referred to in the first edition of "Ferroelectric Thin Film Memory" Chapter 8, pp. 337–345, Jun. 30, 1995 published by Science Forum Co. Ltd.

The inventors of the present invention examined using a ferroelectric memory in place of a ROM and the battery-protected SRAM (Static RAM) for a portable information device. When a part of the ferroelectric memory is used as a ROM, it is necessary to protect ROM data from being re-written by accident due to system runaway or the like.

In one example of a conventional write protection system for discrete or single unit non-volatile memories an EEPROM (Electrically Erasable and Programmable ROM) with software data protection is utilized to prevent false rewriting caused by external noise which typically occurs during packaging. For example, the brief description is referred to in the 17th edition of "Hitachi IC Memory Data Book 3 EEPROM, Flash Memory, EP/OTPROM, Mask ROM" pp. 134–148 (HN58V1001 Series), August, 1995, published by Hitachi, Ltd. (hereafter referred to as technology 1). This EEPROM enters into the protection mode when the combination of a designated address and data is input three times (3-bytes). On the other hand, the EEPROM exits from the protection mode when the combination of a designated address and data is input six times (6-bytes). Such software data protection of the EEPROM is the write-protection technique applied to the whole memory.

An example of a one-chip microcomputer including a built-in ferroelectric memory divided into a ROM area and a RAM area is disclosed in Japan Laid-Open Patent Application No. H. 7-114497 (U.S. patent application Ser. No. 08/295,295) (hereafter referred to as technology 2). This ferroelectric memory is divided into the ROM area to be used as a ROM and the RAM area to be used as a RAM. If an attempt is made to write into the ROM area, the write control signal can be inhibited in order to prevent the data from being written by accident into the ROM address area. The ROM area and the RAM area are placed adjacent to one another in a continuous address space, and the boundary address information between the ROM area and the RAM area is set in the boundary setting register. Therefore, the capacities of the ROM and the RAM areas are interchangeable.

SUMMARY OF THE INVENTION

The software data protection system of the EEPROM of the above-described technology 1 is applied to the whole memory with regard to write protection/permission. That is, this protection system does not allow the unit memory to be divided into the ROM area and the RAM area. Therefore, it does not allow to use a part of the address area in a unit memory as ROM to protect said ROM area against writing. When plural memories are used in the whole system and each of them is set to be write-protective or write-permissive, respectively, the same kinds of memory will be able to be used as ROM as well as RAM. However, the problem described later is left when the memory is used as a RAM. Furthermore, plural write-cycles are required for each memory to set write-protection/permission, resulting in inconvenient operation.

In a typical electrically reloadable non-volatile memory such as an EEPROM, the write-cycle is generally much longer than the read-cycle. Also, the access time for such an electrically reloadable non-volatile memory is longer than that of the typical general purpose dynamic RAM (DRAM). For example, in the EEPROM of the above-mentioned technology 1, the maximum address access time of the write-cycle is 15 ms and the maximum address access time of the read-cycle is 250 ns. Therefore, when using such an EEPROM as a RAM, the address access time of the write-cycle will be a problem.

Ferroelectric memories are high-speed reloadable or rewritable (the address access times of the read-cycle and of the write-cycle are equal or equivalent.) non-volatile memories. Although the address access time of such a ferroelectric memory is typically longer than that of a general purpose discrete SRAM (Static RAM), it is equivalent to that of the general purpose dynamic RAM (DRAM) or of a typical pseudo Static RAM (SRAM). Hence the ferroelectric memory is usable as a RAM even though it is a non-volatile memory. The inventors of the present invention examined making the pin arrangement and the read-cycle and write-cycle timing of the ferroelectric memory the same as those of the typical general purpose discrete SRAM or the typical pseudo SRAM so that a ferroelectric memory may be substituted for a RAM or a ROM in a conventional system.

When a ferroelectric memory is used for both RAM and ROM, the write-protective function is required. The inventors of the present invention have determined that there are various factors which are described later, which must be considered when the write-protection function is added to the ferroelectric memory if it is to be compatible with a general purpose discrete SRAM or a Pseudo SRAM. There is no existing general purpose discrete SRAM or pseudo SRAM with the write-protection function, and therefore the similar problems are left when adding the write-protection function to the general purpose single unit SRAM or the pseudo SRAM.

In the write-cycle of a general purpose discrete SRAM or pseudo SRAM, the address signal is input at first, then the chip select ICS is asserted (active) and subsequently write-enable/WE is asserted. Consequently, the write-cycle operates the same as the read-cycle until the write-enable /WE is asserted. That is, the data reading operation is interrupted by the write-permission signal generated based on the write-enable/WE signal during the reading operation of the data from the memory array. When the timing of the read cycle and the write cycle of the ferroelectric memory is set to the similar timing of those of the general purpose discrete SRAM or the pseudo SRAM, the write cycle of the ferroelectric memory is required to be of the same timing operation as that of said general purpose discrete SRAM Qr the pseudo SRAM. The write-protection function is also required to be compatible with these cycles.

To make the write-protection function more convenient, the inventors have determined that the memory area of the ferroelectric memory should be divided into several blocks and the new write-protection function should be added. This allows setting the write-protection area by the unit of a block and to also set the re-writable area freely and/or with discontinuity. These settings should be in the same range of operation timing as that of the read or write cycle of the general purpose discrete SRAM or pseudo SRAM. To be more specific, the external address signal is compared with the address information previously set as the write-protection block and, depending on the comparison result, the write-permission signal will be inhibited from being generated. Therefore, a delay will occur in generating the control signal of the read cycle or the write cycle because the memory means (memory circuits) to store the address information of the write-protection block and the comparison means (comparison circuit) to compare the external address signal with the address information of the write-protection block are required. As for the electrically reloadable non-volatile memory of the above-noted technology 1, the write-cycle is much longer than the read-cycle so that the delay may be so small as to be ignored compared with the write-cycle. That is, the delay in generating the control signal of the read cycle and the write cycle will be actualized for the first time when the write-protection function is added to the memories with the same level of read and write cycles and where both RAM and ROM work in one memory unit in high speed cycle.

When the write protection function is expected to work in the timing equivalent to that of a discrete SRAM or a pseudo SRAM, it should determine at high speed if the area is write-protected or not. As one way to achieve this purpose, it was examined to decrease the bit number of the address signal used for the judgment of the area. That is, when the memory area is divided into plural blocks, the bit number of the address signal for the judgment of the areas can be decreased. For example, when the memory is divided into eight blocks, each block may be judged by comparing only the high order three bits of the address signal. Furthermore, when the memory area is divided into plural blocks, the write-protection/permission can be set block by block and also the ROM area and the RAM area can be set freely block by block.

The ferroelectric memory of the above-mentioned technology 2 does not have a discontinuous write-protection area. That is, the ROM area and the RAM area are not allowed to be set in an arbitrary address. It is not allowed to set the discrete plural addresses as the ROM or the RAM area. Besides, all bits of the address signal must be compared to judge whether they are of the ROM area. or the RAM area. Therefore, the judgment of the area requires a long time. Furthermore, because the read/write-cycles are not set at the timing equivalent to that of a general purpose discrete SRAM or a pseudo SRAM, it is not possible in the technology 2 to quickly judge whether a memory area is write-protected or write-permissive.

One of the objects of the present invention is to realize a flexible write-protection arrangement in a non-volatile memory with equivalent read/write cycles.

Another object of the present invention is to realize write-protection in a memory compatible with a general purpose discrete SRAM or pseudo SRAM.

Yet another object of the present invention is to provide an optimum circuit configuration to minimize the delay resulting from write-protection.

The above mentioned and other objects and new characteristics of the present invention will become clear through the description of the specification in conjunction with the accompanying drawings.

The typical outline of the invention disclosed here will now be briefly described. To beginning with, a semiconductor memory device is provided in which a memory array is divided into plural blocks and equipped with plural non-volatile memory elements which enable the read and the write cycles to be substantially equivalent. Plural storage elements are also provided to store the information of write-protection/permission of the corresponding plural blocks. A setting circuit is then used to set the information of the write-protection/permission into the storage elements. In particular, the setting circuit sets the write-protection information to the storage elements in the write-cycle after designated plural read-cycles.

Furthermore, after turning the power on, all the blocks of said semiconductor memory device are set together to the write-protection state, and then write-protection/permission information stored previously is automatically set for each block. Alternatively, after turning the power on, all the blocks of said semiconductor memory-device may be initially set to the write-protection state and then write-protection/permission information stored previously may be set according to the plural read-cycles of the designated address combination.

Consequently, the write-protection/permission can be set for plural block units. Therefore, the RAM area and the write-protected ROM area can be set freely. Furthermore, the complexity of the setting procedure of write-protection/permission can prevent an accidental false setting caused by system runaway or the like.

Write-protection is realized in accordance with the invention by circuits which check at high speed in the first half of the write-cycle whether the accessed address is in the write-protection area or not and another circuit to disable the write-signal in the latter half of the write-cycle. The write-protection is executed by disabling the external write-control signal within the system. Therefore, until the word line of the memory array is booted into the selective state and the bit line signal is amplified, the operation in the write-cycle for the write-protected block area is executed the same as that in the read-cycle operations for other blocks. The write-protection can be made effective after the first transition of the word line, hence the write-protection can be realized while retaining the high speed performance of the write-cycle in the write-protected area.

The protected address holding circuit includes the non-volatile memory element and latch circuit in order to check at high speed whether the accessed address is in the write-protected area or not, and to make the write-protection data setting non-volatile. The data of the single or plural block(s) to be write-protected (protected block), which are stored in the non-volatile memory element, will be written in the latch circuit after turning the power on. When new write-protection area(s) is(are) set, the data of single or plural block(s) (protected block) to be write-protected are written in both of the non-volatile memory element and the latch circuit in the same write-cycle.

Due to the protected address holding circuit configuration, the checking operation of whether the accessed address is in the write-protected area or not is executed by comparing the decoded results of the high-order of the input address signal with the output of the latch circuit without reading the protected information stored in the non-volatile memory. This system does not compare the protected information stored in the non-volatile memory of the protected address holding circuit with the input address signal, but compares the protected information stored in latch circuit with the decoded result of the high order of the input address signal, so that the operation to read the protected information stored in the non-volatile memory of the protected address holding circuit for each address access is not required and the high speed judgment can be achieved by shortening the operation time.

In this case, the checking operation as to whether the accessed address is in the write-protected area or not is executed by comparing the decoded results of the high-order of the input address signal with the output of the latch circuit. In this case, the judgment of the location can be executed in a shorter time than is the case where the decoded result of all the address signals is compared with the latch circuit output.

The setting of new protected address can be operated the same as in the normal write-cycle by adding the non-volatile memory in the protected address holding circuit to a part of the memory array, so that the setting information in the write-protected area can be made to be non-volatile.

After turning the power on, the information stored in the non-volatile memory of the protected address holding circuit is required to be stored in the latch circuit, but the address information of the write-protected area can be automatically set in the latch circuit after turning the power on by making a part of the reset sequence of the block protection to be a read-cycle of the non-volatile memory cell.

Alternatively, a power-supply voltage detecting circuit may be provided in the memory (semiconductor storage circuit device). That allows the read-cycle of the non-volatile memory cell in the protected address holding circuit to be automatically executed in response to the output of the power-supply voltage detecting circuit when turning the power on, so that the address information in the non-volatile memory may be set in the latch circuit.

Therefore, a RAM/ROM integrated memory (semiconductor storage circuit device) with a variable write-protected area, which enables high speed writing equivalent to that of the general purpose discrete SRAM or pseudo SRAM, is provided.

BRIEF DESCRIPTION OF THE DRAWINGS

FIG. 8 is a sequence diagram showing a part of the procedure of write-protection setting/cancellation of the ferroelectric memory of the present invention;

FIG. 9 is a sequence diagram showing a setting procedure for block protection of the ferroelectric memory of the present invention;

FIG. 10 is a sequence diagram showing a reset procedure of block protection of the ferroelectric memory of the present invention;

FIG. 11 is a diagram showing a setting procedure of the write-protected area of the ferroelectric memory of the present invention;

DETAILED DESCRIPTION OF THE PREFERRED EMBODIMENTS

<General Configuration>

Figure 1:
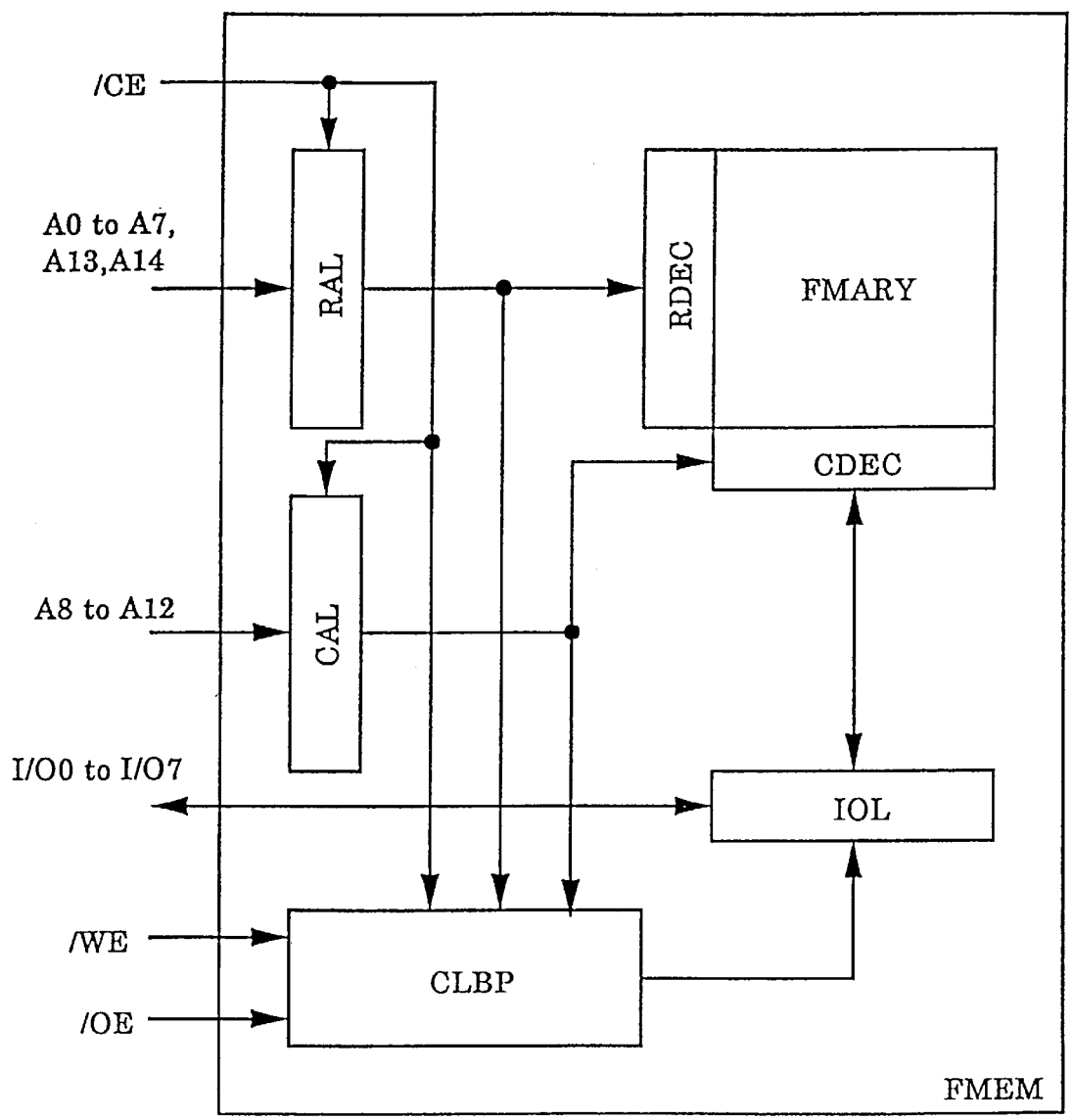
FIG. 1 is a block diagram of the ferroelectric memory of the present invention.

FIG. 1 is a block diagram of an embodiment of a ferroelectric memory of the present invention. The ferroelectric memory FMEM comprises a memory array FMARY, a row decoder RDEC, a column decoder CDEC, an I/O latch IOL, a row address latch (latch circuit) RAL, a column address latch CAL, and a control logic and block protection circuit CLBP, and is formed on a semiconductor substrate which can be made, for example, of a single crystal silicon. The circuit configuration of these elements, except for that of the control logic and block protection circuit CLBP, may be easily understood by those skilled in the art, so that it will not be described here in detail. The details of the control logic and block protect circuit CLBP will be described later.

By way of example, the memory array FMARY contains 1024_~256=256K (K=1024) units of memory cells each of which stores a bit of binary information. The ferroelectric memory FMEM consists of 32K words_~8 bits, so that it contains ten row addresses and five column addresses.

Figure 2:
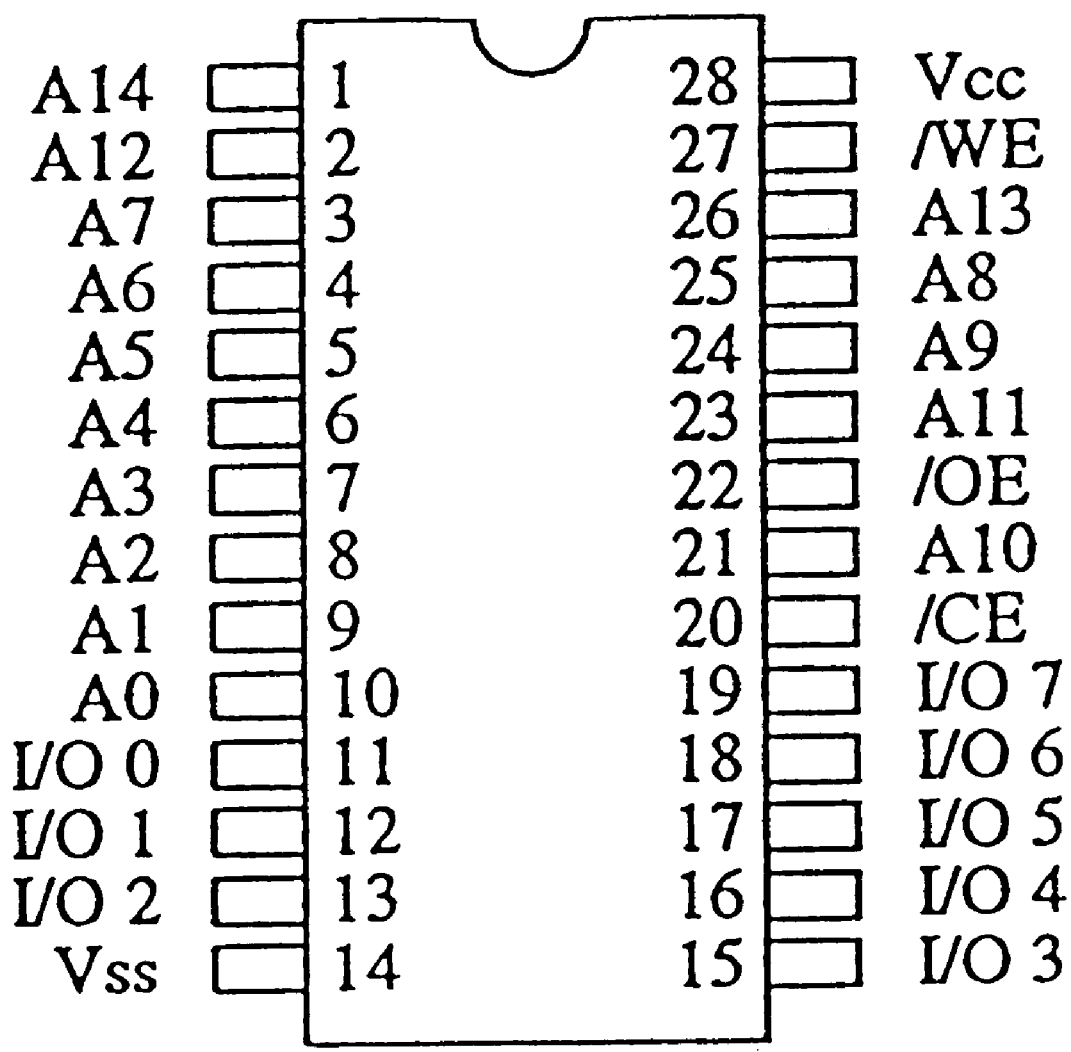
FIG. 2 is a pin arrangement drawing that can be used for the ferroelectric memory of the present invention.

FIG. 2 shows a pin arrangement which can be used for the ferroelectric memory of the present invention shown in FIG. 1. The ferroelectric memory FMEM is formed and enclosed into a 450 mil 28 pin plastic SOP (Small Outline Package) or the like by resin molding technology. The pin arrangement of the ferroelectric memory FMEM is compatible with that of a 256K bits pseudo SRAM (Pseudo Static RAM) of 32K words_~8 bits configuration. A0–A14 are external terminals for the address input signal; I/O0–I/O7 are external terminals for the data input/output; /WE is an external terminal for the write enable signal; /CE is an external terminal for the chip enable signal; /OE is an external terminal for the output enable signal; Vcc is an external terminal for the power source (3 V); and Vss is an external terminal for grounding (0 V). The pin arrangement of the ferroelectric memory FMEM is compatible with that of a 256K bits SRAM (Static RAM) of 32K words_~8 bits configuration, because only the chip select (/CS) signal on the 20th pin in the SRAM is replaced by the chip enable (/CE) signal in the FMEM. In this specification, each symbol of A0–A14, I/O0–I/O7, /WE, /OE is used to describe the specified signal or the corresponding external terminal, respectively.

The chip enable (/CE) is active at "Low" level and inactive at "High" level. When the chip enable transits to low level, the ferroelectric memory FMEM introduces the addresses A0–A14 from outside into the memory inside.

The addresses A0–A7, A13, A14 are row address signals and the addresses A8–A12 are column address signals.

The write enable (/WE) is a switching signal between the read cycle and write cycle, and when it is in "Low" level (active level), the ferroelectric memory FMEM is switched to write mode. When either the chip enable (/CE) signal or the write enable (/WE) signal rises up, whichever comes first, the write data are introduced into the ferroelectric memory.

The output enable (/OE) is active at "Low" level and inactive at "High" level.

The functions corresponding to the combinations of the write enable (/WE), the chip enable (/CE) and the output enable (/OE) are as follows:

(1) (/WE, /CE, /OE)=(X, H, X)

The ferroelectric memory FMEM is set to a chip non-selective mode and each output terminal of the output buffer connected to a corresponding data input/output terminal is set to high impedance. Hereinafter, H and L mean "High" and "Low" levels, respectively, and X means either H or L.

(2) (/WE, /CE, /OE)=(H, L, H)

The ferroelectric memory FMEM is set to an output disable mode and each output terminal of the output buffer connected to a corresponding data input/output terminal is set to high impedance.

(3)(/WE, /CE, /OE)=(H, L, L)

The ferroelectric memory FMEM is set to a read mode and each output buffer corresponding to each data input/output terminal is set to an output enable state.

(4) (/WE, /CE, /OE)=(L, L, H)

The ferroelectric memory FMEM is set to an output write mode and each input buffer corresponding to each data input/output terminal is set to an input enable state. Each output terminal of the output buffer corresponding to each data input/output terminal is set to high impedance.

(5) (/WE, /CE, /OE)=(L, L, L)

The ferroelectric memory FMEM is set to a write mode and each output buffer and each data input buffer corresponding to each data input/output terminal is set to an output enable state and an input enable state, respectively.

Operation Timing

Figure 3:
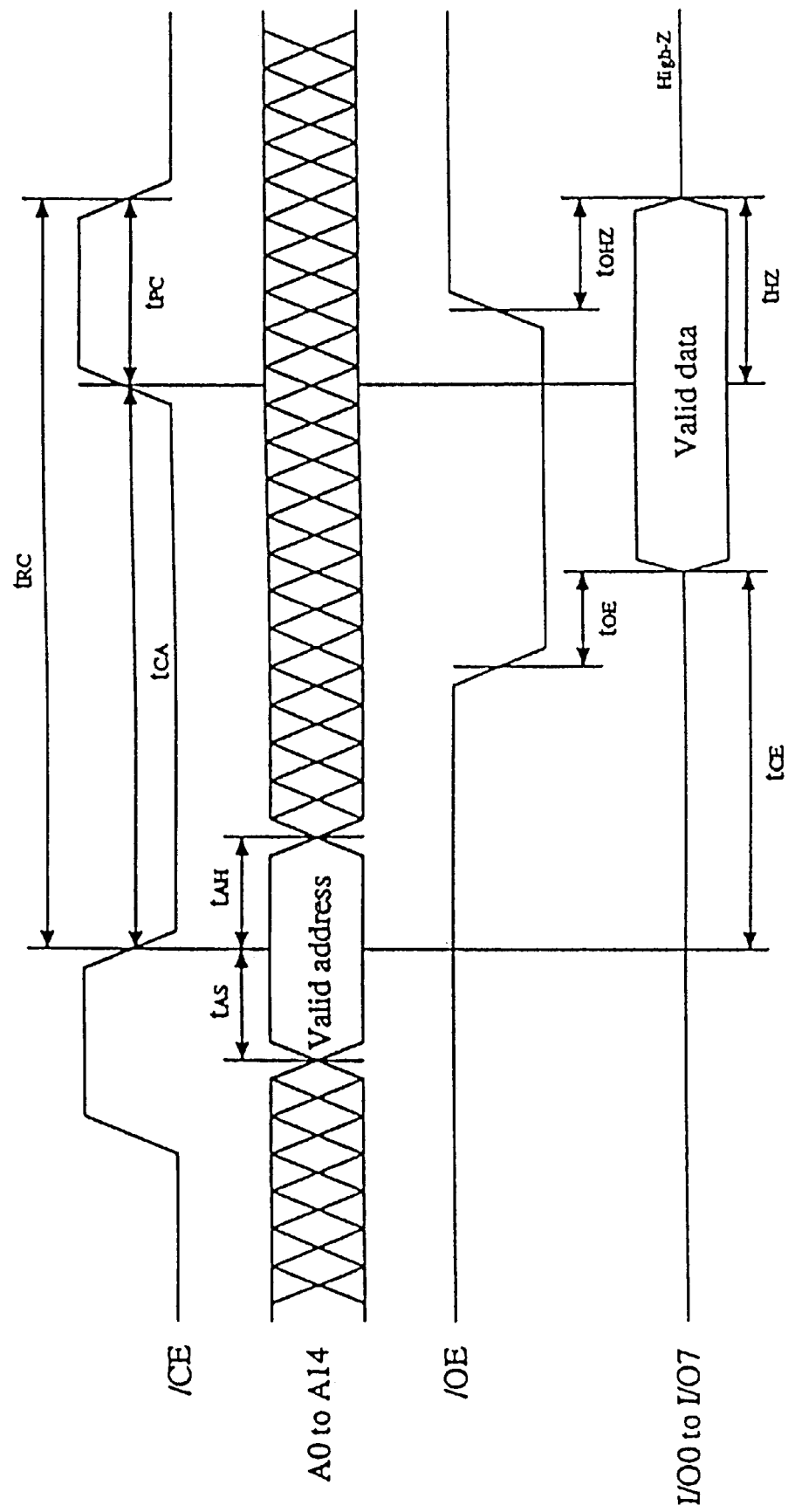
FIG. 3 is a read-cycle timing diagram of the ferroelectric memory of the present invention.
Figure 4:
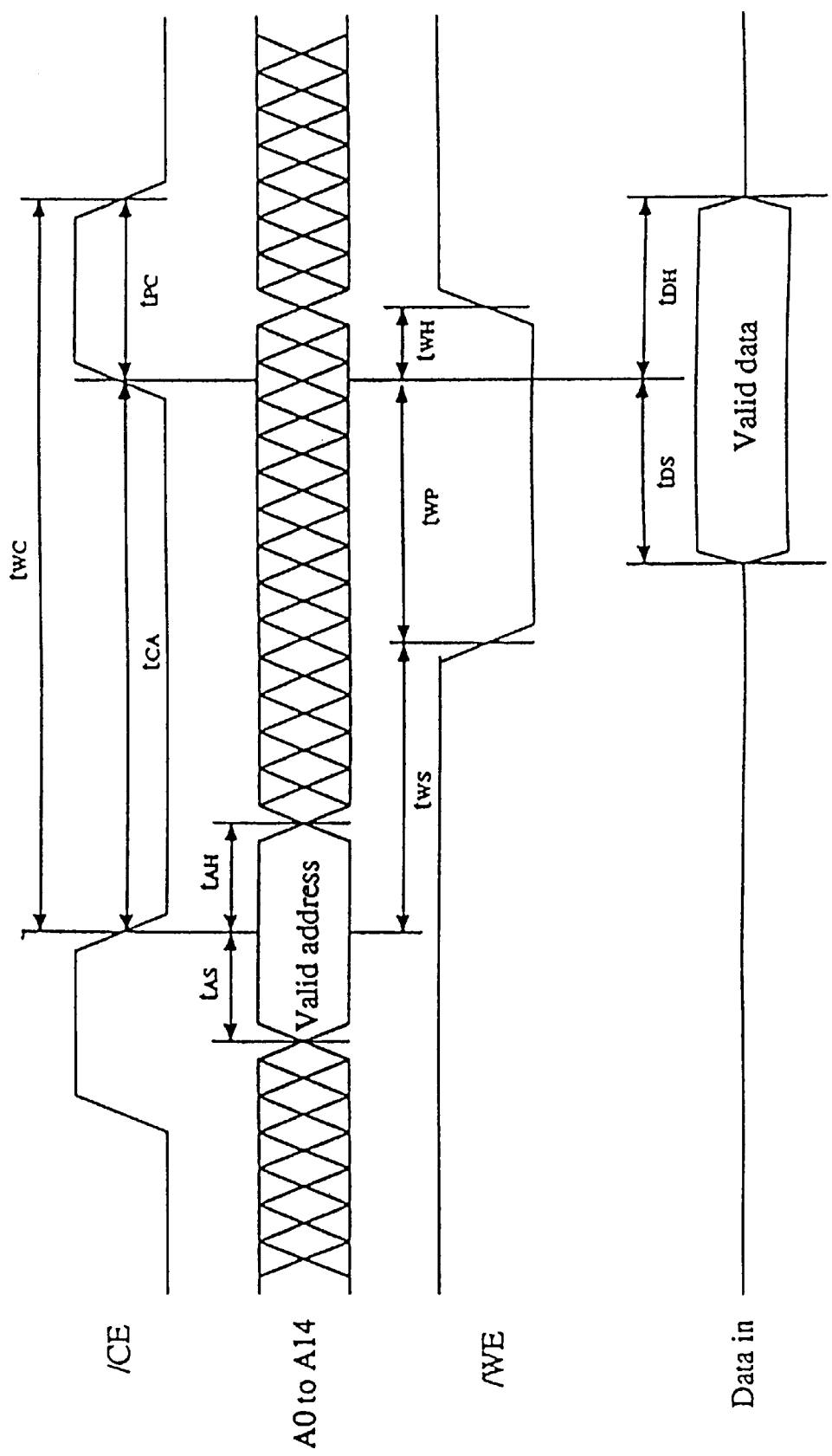
FIG. 4 is a write-cycle timing diagram of the ferroelectric memory of the present invention.

FIG. 3 is a read-cycle timing diagram of the ferroelectric memory of the present invention and FIG. 4 is a write-cycle timing diagram of the ferroelectric memory of the present invention.

Regarding the read cycle as shown in FIG. 3, when the addresses (A0–A14) are input, the chip enable (/CE) transits to low level and the output enable (/OE) transits to low level, after which the read data are output to the data input/output terminals (I/O0–I/O7).

A read cycle time (t RC) is a time period between the time when the chip enable (/CE) transits to the low level and the next time when the chip enable (/CE) becomes able to transit to the low level, and its minimum time is specified. As for the ferroelectric memory FMEM of the present embodiment, t RC=235 ns. For a chip enable pulse width (t CA), the minimum and the maximum times are specified. A chip enable precharge time (t PC) is a precharge time required for the next access, and its minimum time is also specified. An address setup time (t AS) is a setup time of an address for the chip enable (/CE) transition to low level, and its minimum time is specified. An address hold time (t AH) is a hold time of an address for the chip enable (/CE) transition to low level, and its minimum time is specified. A chip enable access time (t CE) is a time period from the time when the chip enable (CE). transits to the low level until the time when the effective data are output, and the maximum time is specified. As for the ferroelectric memory FMEM of the present embodiment, t CE=150 ns. A chip disable output delay (t HZ) is the effective data holding time from the chip enable (CE) transition to high level, and both the minimum and the maximum times are specified. An output enable access time (t OE) is a time period from the output enable (/OE) transition to low level until the effective data output, and the maximum time is specified. An output disable output delay (t OHZ) is the effective data holding time from the output enable (OE) transition to high level, and the maximum time is specified.

Regarding the write cycle as shown in FIG. 4, when the addresses (A0–A14) are input, the write enable (/WE) transits to low level, the chip enable (/CE) transits to low level and the write data are input to the input/output terminals (I/O0–I/O7), after which the input data are introduced into the ferroelectric memory FMEM when the chip enable (/CE) transits to high level.

A write cycle time (t WC) is a time period between the time when the chip enable (/CE) transits to low level and the next time when the chip enables (/CE) becomes able to transit to low level, and its minimum time is specified. As for the ferroelectric memory FMEM of the present embodiment, t Wc=235 ns. A write enable setup time (t WS) is a setup time of the write enable (/WE) transition to low level after the chip enable (/CE) transition to low level, and the minimum time is specified. A write enable hold time (t WH) is a hold time of the write enable (/WE) transition to high level after the chip enable (/CE) transition to low level, and its minimum time is specified. The input data setting time (t DS) is a setup time of the input data after the chip enable (/CE) transition to high level, and the minimum time is specified.

Layout

Figure 5:
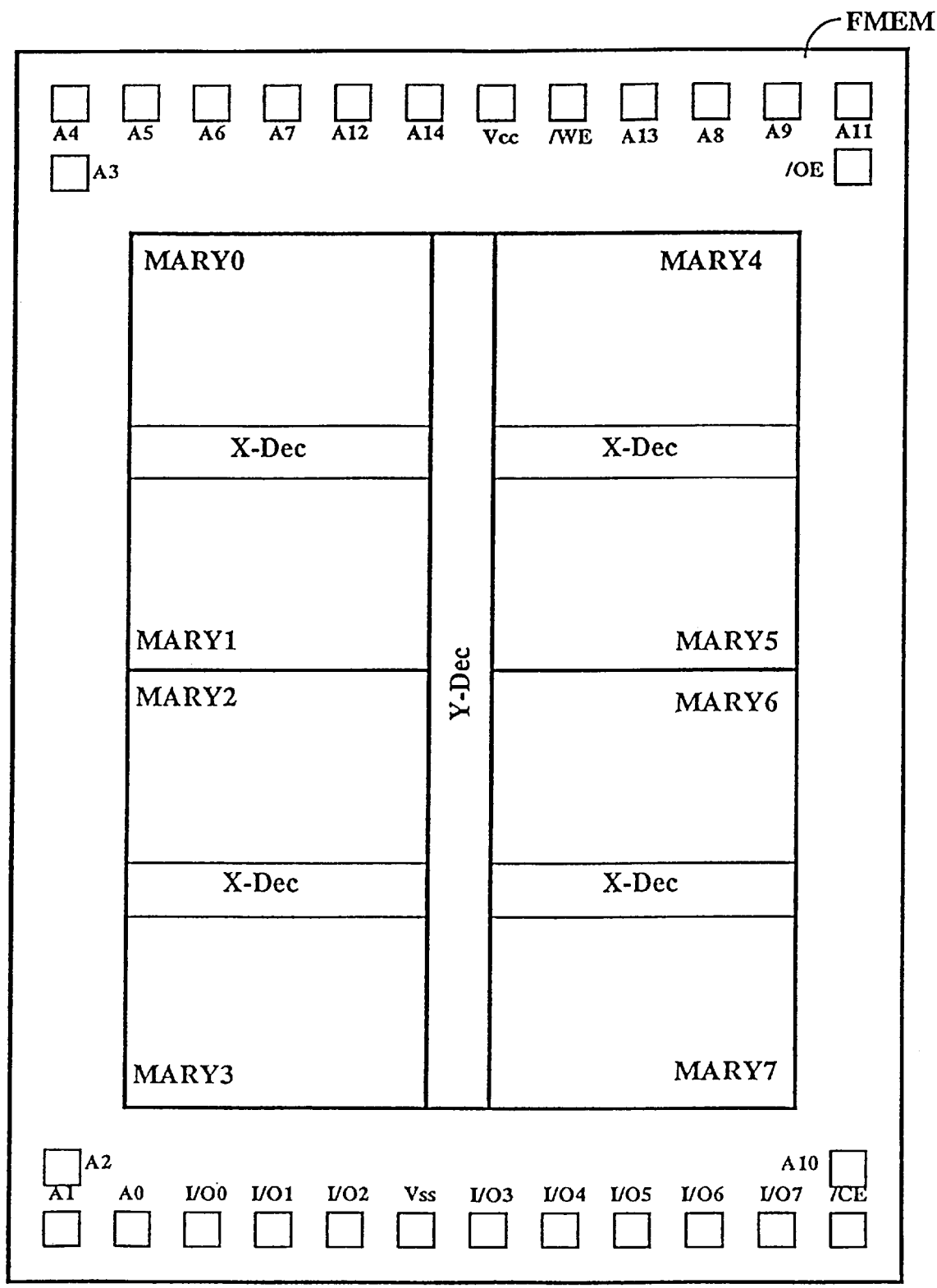
FIG. 5 is a layout drawing of the ferroelectric memory of the present invention.

FIG. 5 is a layout drawing of the ferroelectric memory of the present invention. Each bonding pad for an address (A3–A14), a power source (Vcc), a write enable (/WE) and an output enable (/OE) is arranged on the top of the semiconductor chip. Each bonding pad for an address (A0–A2), data input/output (I/O0–I/O7), an ground (/Vss) and a chip enable (/CE) is arranged on the bottom of the semiconductor chip.

A memory array FMARY is divided into eight pieces physically and arranged in the manner shown in FIG. 5. A row decoder X-Dec is arranged between memory array MARY0 and memory array MARY1. A row decoder X-Dec is arranged also between memory array MARY2 and memory array MARY3. A row decoder X-Dec is also arranged between memory array MARY4 and memory array MARY5. A row decoder X-Dec is also arranged between memory array MARY6 and memory array MARY7. A column decoder Y-Dec is arranged between four memory arrays (MARY0, MARY1, MARY2, MARY3) on the left and four memory arrays (MARY4, MARY5, MARY6, MARY7) on the right.

Memory Array and Basic Operation

Figure 6:
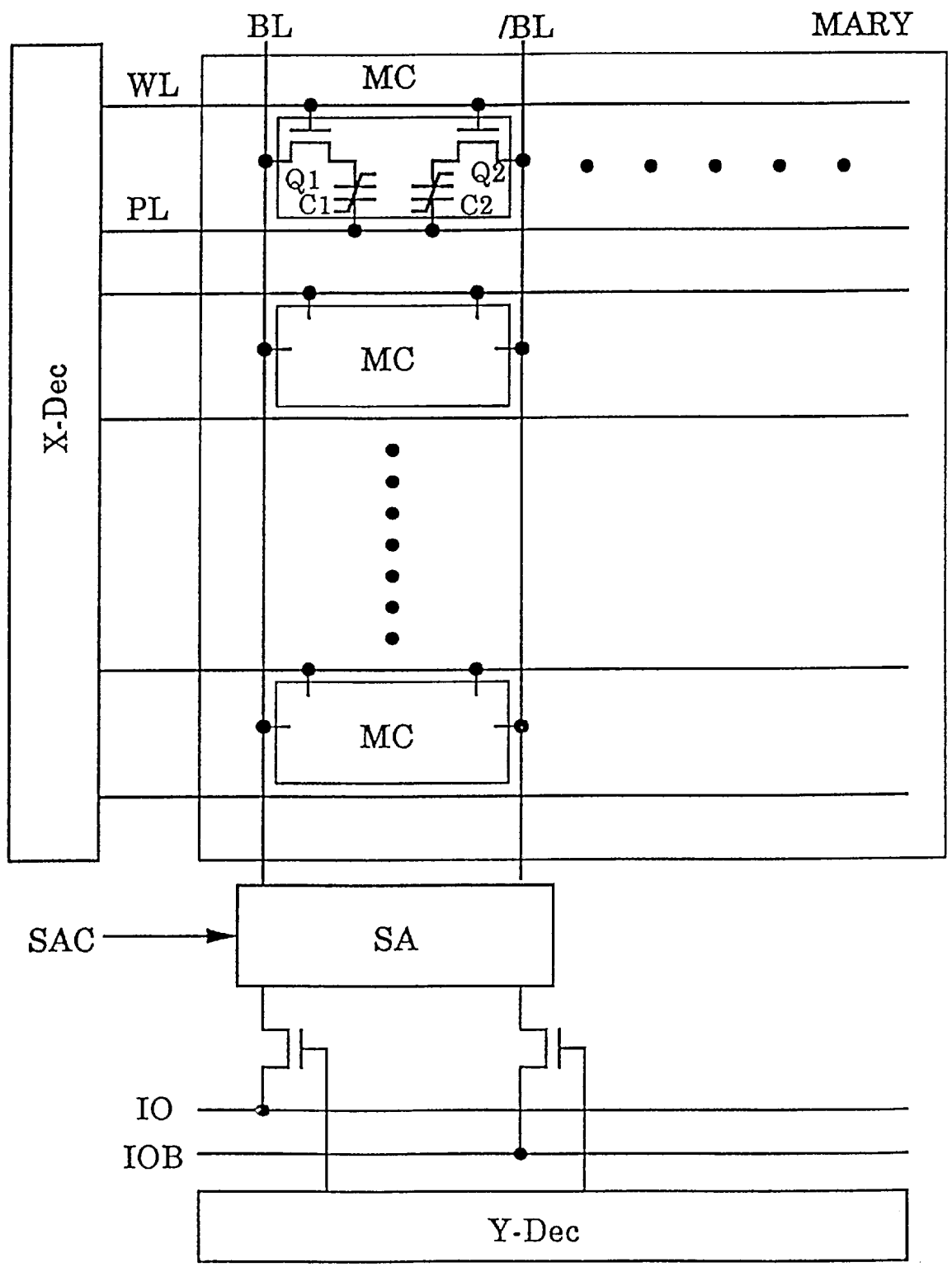
FIG. 6 is a memory array circuit diagram of the memory array of FIG. 1 for ferroelectric memory of the present invention.

FIG. 6 is a conceptual memory array circuit diagram of the ferroelectric memory of the present invention. A memory array MARY corresponds to a part of one piece of each memory array divided into two pieces, respectively, as shown in FIG. 5.

The memory array MARY includes word lines WL; plate lines PL arranged in parallel with said word lines WL; paired bit lines (BL, /BL) arranged to cross said word lines WL and said plate lines PL; and memory cells MC located at intersections of the paired bit lines (BL, /BL) and the word lines WL or the plate lines PL, wherein those components are arranged plurally in matrix form. Each memory cell MC is joined to a word line WL, a plate line PL and a paired bit line (BL, /BL).

A memory cell MC consists of two transistors (Q1, Q2) and two ferroelectric capacitances (C1, C2). Such a memory cell is known as a memory cell with a 2T2C (2 Transistors—2 Capacitances) structure. Such memory cells with the 2T2C structure are characterized by high durability against the degradation of the ferroelectric capacitances and the stability of data reading due to holding the data in two ferroelectric capacitances independently of each other.

Figure 7:
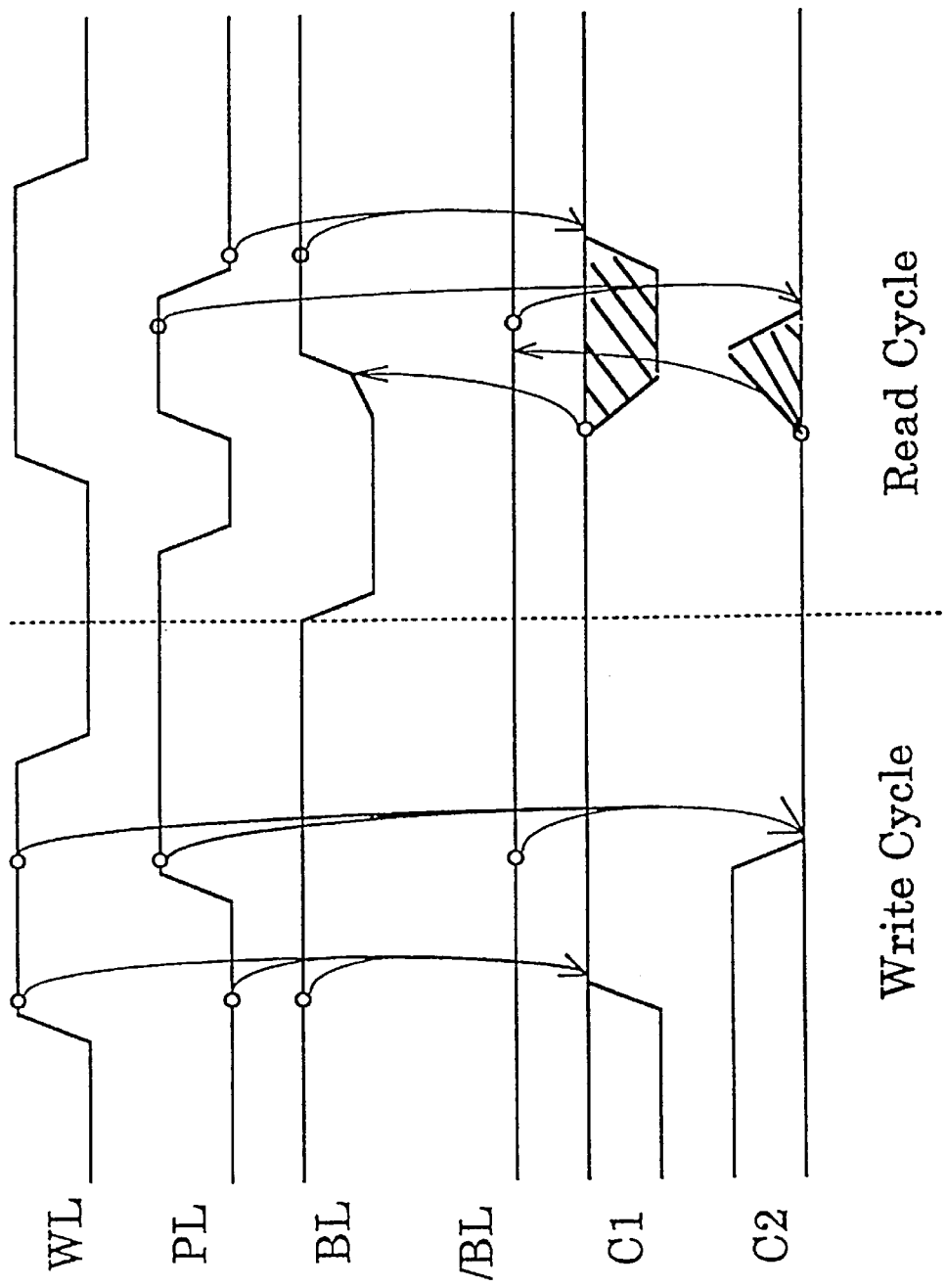
FIG. 7 is a memory array operation timing diagram of the ferroelectric memory of the present invention.

FIG. 7 is an operation timing diagram of the memory array of the ferroelectric memory. Basic operation is as follows:

(1) Basic write operation

The bit line BL and bit line /BL selected by the column decoder Y-Dec are fixed, with exclusive logic, to high level and low level, or to low level and high level, respectively. An explanation will now be provided of the basic write operation in the case where the bit line WL is in "High" level and the bit line /WL is in "Low" level.

To begin with, the plate line PL selected by the row decoder X-Dec is set to "Low" level. Then, the word line WL selected by the row decoder X-Dec is set to "High" level and MOS transistors Q1 and Q2 of N-channel model are set to a conductive state. At that time, the ferroelectric capacitance C2 connected to bit line /BL does not undergo polarization inversion and holds the current data because the plate line PL and the bit line /BL are in "Low" level. As for the ferroelectric capacitance C1 connected to bit line BL, however, the plate line PL is in "Low" level and the bit line BL is in "High" level so that the ferroelectric capacitance C1 undergoes polarization inversion in that direction. Consequently, the data are written into the ferroelectric capacitance C1.

Then, the plate line PL transits from "Low" level to "High" level. Through this operation, the plate line PL and the bit line BL are set in "High" level so that the ferroelectric capacitance C1 may keep the polarization state as it was. As for the ferroelectric capacitance C2, on the other hand, the plate line PL is in "High" level and the bit line /BL is in "Low" level so that the ferroelectric capacitance C2 undergoes polarization inversion in that direction. This direction of polarization inversion of the ferroelectric capacitance C2 is opposite to that of the ferroelectric capacitance C1. Consequently, the data of the ferroelectric capacitance C1 and the data of exclusive logic are written into the ferroelectric capacitance C2. Therefore, the data can be discriminated easily in comparison while reading due to the opposite direction writing.

Lastly the word line WL is set to "Low" level and the MOS transistors Q1 and Q2 of N-channel type are led to cut-off status, after which the write sequence is terminated.

(2) Basic read operation

The basic read operation will now be explained in the case where the ferroelectric capacitance C1 is polarized as the upper side (Q1 side of the MOS transistor of N-channel type) is "High" level and the lower side (plate line PL side) is "Low" level and the ferroelectric capacitance C2 is polarized as the upper side (Q2 side of the MOS transistor of N-channel type) is "Low" level and the lower side (plate line PL side) is "High" level.

First, the bit line BL and the bit line /BL are precharged to the ground potential ("Low" level). After being precharged, the bit line BL and the bit line /BL are set to high impedance state.

Next, the plate line PL selected by the row decoder X-Dec is set to "Low" level and then the word line WL selected by the row decoder X-Dec is set to "High" level and the MOS transistors Q1 and Q2 of N-channel type are set to conductive states. Consequently, the ferroelectric capacitances C1 and C2 are set to "Low" level in both terminals so that the ferroelectric capacitances C1 and C2 keep the polarization inversion state.

Then, the plate line PL transits from "Low" level to "High" level. At that time, the ferroelectric capacitances C1 and C2 release the electric charge with the quantity of the released electric charge depends on the direction of the applied polarization. The quantity of the electric charge of the ferroelectric capacitance C1 in which the plate line PL side is polarized to "Low" level is more than that of the ferroelectric capacitance C2 in which the plate line PL side is polarized to "High" level. The released electric charges emerge as the voltage on the bit line BL and the bit line /BL, respectively. In this case, the ferroelectric capacitance C1 releases more electric charge so that the voltage of the bit line BL may be higher than that of the bit line /BL.

When the voltage is generated on the bit line BL and Bit line /BL, a sense amplifier SA is actuated through the sense amplifier control signal SAC so that the voltage difference between the bit line BL and the bit line /BL may be amplified. Consequently, the bit line BL is set to "High" level and the bit line /BL is set to "Low" level and each is read out in the common input/output line IO and IOB, respectively.

The read out sequence is as described above and if they are left as they are, the data stored in the ferroelectric capacitances C1 and C2 are left damaged so that the data needs to be rewritten.

By the sequence described above, the bit line BL is set to "High" level; the bit line /BL to "Low" level; the plate line PL to "Low" level; and the MOS transistors Q1 and Q2 are set to conduction states. Therefore, the ferroelectric capacitance C1 is re-written in this state.

Next, the plate line PL transits from "Low" level to "High" level. Through this operation, the bit line /BL side of the ferroelectric capacitance C2 is set to "Low" level and the plate line PL side is set to "High" level and re-writing is executed. At that time, the ferroelectric capacitance C1 is set to "High" level in the plate line PL side and in the bit line BL side and, therefore, the polarization state is kept as it was.

Lastly the word line WL is set to "Low" level and the MOS transistors Q1 and Q2 of N-channel type are led to cut-off status, so that the read sequence is terminated.

Write-Protection Setting/Cancellation

FIG. 8–FIG. 10 are sequence diagrams showing embodiments of the procedure of write-protection setting/cancellation of the ferroelectric memory of the present invention.

FIG. 8 shows the write protection sequence for the whole chip. The sequence which produces a write-protection enable is set by input of seven groups of designated addresses into the ferroelectric memory FMEM from outside of the chip while executing the read cycle. As an example, the designated addresses can be $1823, $1820, $1822, $0418, $041B, $0419, $040A, and the write-protection is set by seven read cycle executions to these designated addresses. "$" means hexadecimal notation.

On the other hand, the sequence which makes write-protection disable is set also by input of seven groups of designated addresses into the ferroelectric memory FMEM from outside of the chip while executing the read cycle. As an example, the designated addresses can be $1823, $1820, $1822, $0418, $041B, $0419, $041A, and the write-protection is canceled by seven read cycle executions to these designated addresses. The difference between the write-protection setting and the cancellation is only in the address of the seventh cycle.

FIG. 9 shows the setting sequence of the block protection. After the seven read cycles are executed to the designated addresses ($1823, $1820, $1822, $0418, $041B, $0419, $041A), the write-protection is set by the write cycle execution to the designated address ($040F) in the eighth cycle. One or plural block(s) to be write-protected is (are) designated by the input data of the data input/output (I/O0–I/O7) in the eighth write cycle and one or plural block(s) to be write-protected is (are) set based on said data.

FIG. 10 shows the reset sequence of the block protection. After the seven read cycles are executed to the designated addresses ($1823, $1820, $1822, $0418, $041B, $0419, $041A), the write-protection is reset by the read cycle execution to the designated address ($040F) in the eighth cycle. The write-protection reset block is set by the eighth read cycle. That is, the block protection data stored in the memory array FMARY by the write-protection setting sequence mentioned above are read out to the latch and are reset.

The ferroelectric memory FMEM is divided into eight blocks. FIG. 11 shows the relation between the block number and the high-order 3-bit addresses (A14, A13, A12) and the relation-between the block number and the number of data input/output I/O. 8-bit data of the eighth write cycle correspond to the write-protection settings/cancellations of the eight blocks, respectively. The data input/output I/O0–I/O7 correspond to the block 0–7, respectively. The signals "1" and "0" indicate the write-protection setting and cancellation, respectively.

Figures 12, 13:
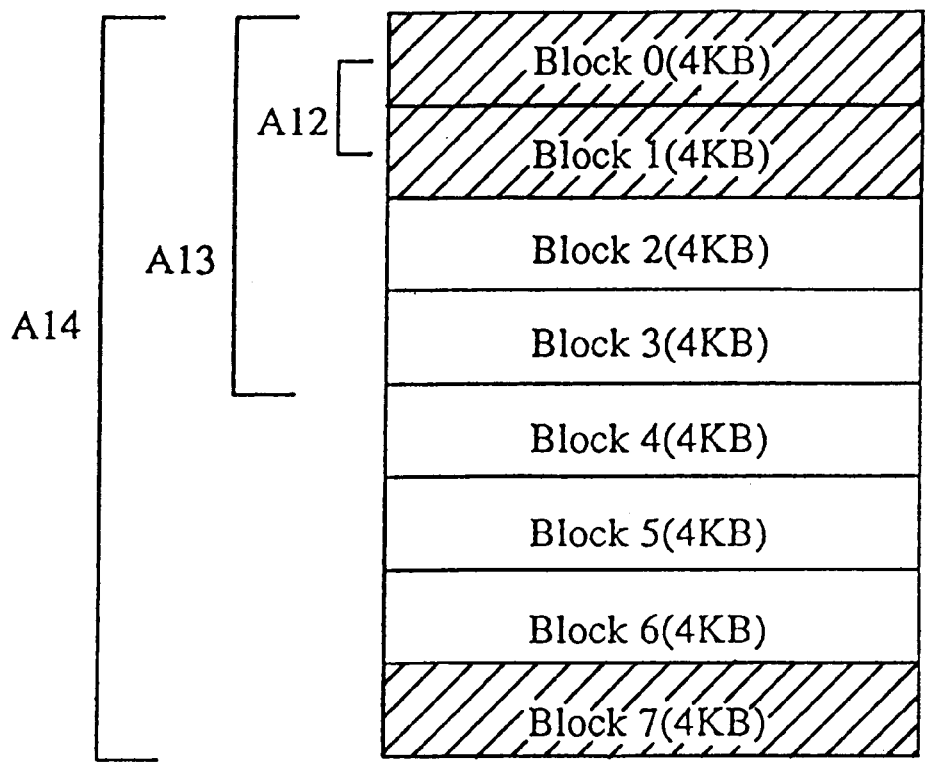
FIG. 12 is a drawing to show a memory address space of the ferroelectric memory of the present invention.
FIG. 13 is a diagram showing a setting procedure of write protection of the ferroelectric memory corresponding to FIG. 12.

FIG. 12 shows the memory address space of the ferroelectric memory of the present invention. The block 0 is in the lower address side and the block 7 is in the upper address side. Each block has a capacity of 4 KB (kilo-bytes). FIG. 13 shows an example of the data entered into the data input/output I/O at the eighth cycle of the block protection setting sequence. I/O0, I/O1 and I/O7 are indicated as "1". Corresponding to these indications, the block 0, the block 1 and the block 7 of the memory address space in FIG. 12 are write-protected.

Figure 14:
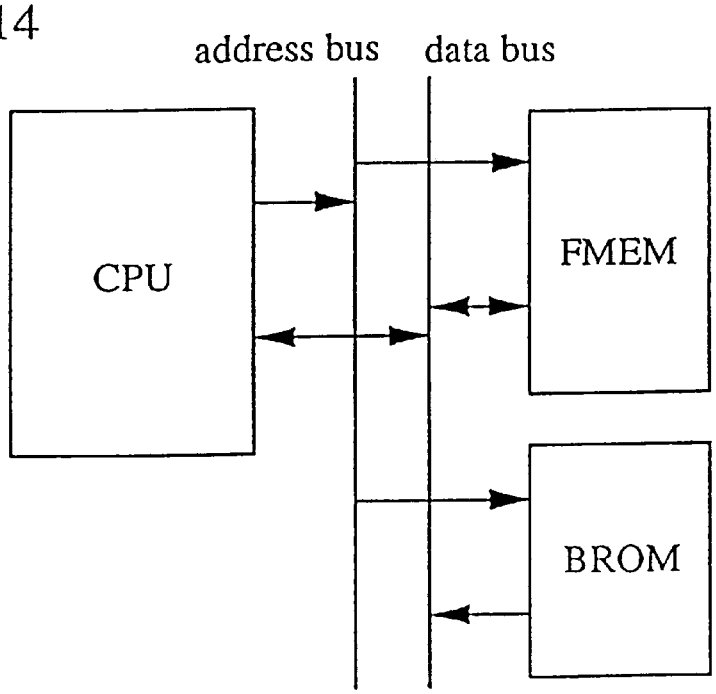
FIG. 14 is a drawing to show a storage location of the program for write-protection setting/cancellation of the ferroelectric memory of the present invention.
Figure 15:
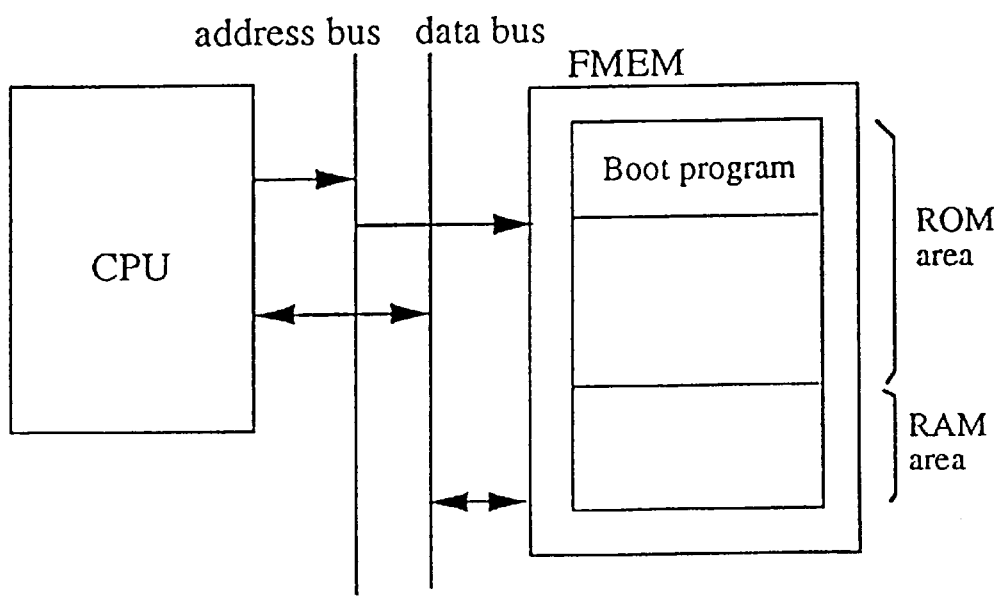
FIG. 15 is a drawing to show another example of a storage location of the program for write-protection setting/cancellation of the ferroelectric memory of the present invention.

The read cycle and the write cycle required in the setting/cancellation sequence of write-protection shown in FIGS. 8–10 are operated by the execution of the designated program in the central processing unit CPU included in the microprocessor and the data processor. This program is stored as a part of the system booting program. FIG. 14 shows a data processing system of a portable data processor such as a PDA where the boot program is stored in a boot ROM (BROM) other than the ferroelectric memory FMEM. On the other hand, FIG. 15 shows a data processing system for a portable data processor such as a PDA where the ferroelectric memory FMEM is packaged into the present system after the boot program is written in the ferroelectric memory FMEM by another system (e.g. personal computer).

General Configuration of the Write-Protection Circuit

Figure 16:
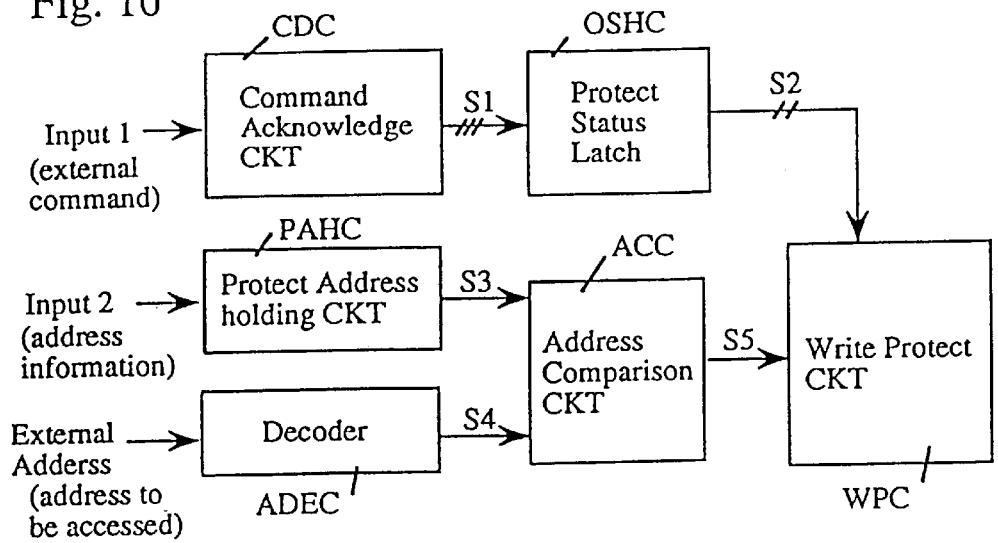
FIG. 16 is a block diagram of a write-protection circuit of the ferroelectric memory of the present invention.

FIG. 16 shows a block diagram of the write-protection circuit of the present invention. As shown in FIG. 16, the write-protection system comprises a command detecting circuit CDC to judge whether the write-protection area is to be applied to all of the ferroelectric memory FMEM or just a part of it as the block protection, or whether no write protection is to be used; an operation state holding circuit OSHC to decide the operation state in accordance with the output of the command detecting circuit CDC; a protected address holding circuit PAHC to store the area to be protected; an address decoder ADEC to decode the accessed address; an address comparison circuit ACC to judge whether the accessed address is in the write-protected area or not; and a write-protection circuit WPC to inhibit the writing when the address is in the protection area and in the write-protected state.

The command detecting circuit CDC generates an output S1 when it detects the write-protection command and changes the state of the operation state holding circuit OSHC in response. The address comparison circuit ACC compares the information of the protected addresses with the output S4 of the address decoder ADEC and output the comparison result S5. The write-protection circuit WPC, according to the output S2 of the operation state holding circuit OSHC, controls the writing when the comparison result S5 is in "High" level.

Command Detecting Circuit and Operation State Holding Circuit

Figure 17:
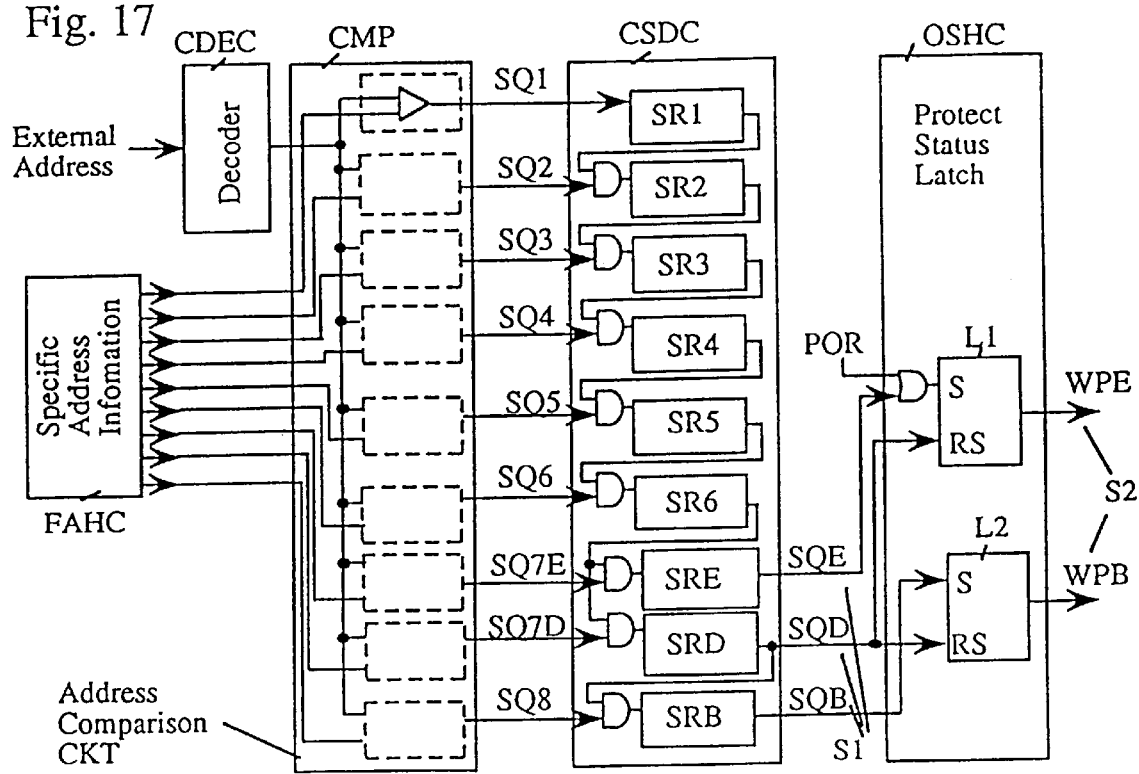
FIG. 17 is a part of a circuit diagram of a write-protection circuit shown in FIG. 16 of the ferroelectric memory of the present invention.

FIG. 17 shows a detailed block diagram of the command detecting circuit CDC and the operation state holding circuit OSHC. As shown in FIG. 17, the command detecting circuit CDC comprises a command address decoder CDEC to decode the input address; a fixed address holding circuit FAHC to hold the fixed addresses ($1823, $1820, $1822, $0418, $041B, $0419, $041A, etc.) defined by the external specification of the ferroelectric memory FMEM; an address comparison circuit CMP to compare the output of the command address decoder CDEC with the output of the fixed address holding circuit FAHC; and a command sequence detecting circuit CSDC to check the input order of the command addresses. When the fixed address and the input address coincide by comparison with each other, the address comparison circuit CMP sets one of nine signals, SQ1, SQ2, SQ3, SQ4, SQ5, SQ6, SQ7E, SQ7D,SQ8, to "High" level. For example, when the input address is $1823, the signal SQ1 goes to "High" level. When the input address is $1820, the signal SQ2 goes to "High" level. When the input address is $1822, the signal SQ3 goes to "High" level. When the input address is $0418, the signal SQ4 goes to "High" level. When the input address is $041B, the signal SQ5 goes to "High" level. When the input address is $0419, the signal SQ6 goes to "High" level. When the input address is $041A, the signal SQ7E goes to "High" level. When the input address is $040A, the signal SQ7D goes to "High" level. When the input address is $040F, the signal SQ8 goes to "High" level.

These signals become the input signals to the eight step shift resister of the command sequence detecting circuit CSDC. The AND of the output of the shift resister SR1 and the signal SQ2 is entered into the shift resister SR2. The AND of the output of the shift resister SR2 and the signal SQ3 is entered into the shift resister SR3. The AND of the output of the shift resister SR3 and the signal SQ4 is entered into the shift resister SR4. The AND of the output of the shift resister SR4 and the signal SQ5 is entered into the shift resister SR5. The AND of the output of the shift resister SR5 and the signal SQ6 is entered into the-shift resister SR6. The AND of the output of the shift resister SR6 and the signal SQ7E is entered into the shift resister SRE. The AND of the output of the shift resister SR6 and the signal SQ7D is entered into the shift resister SRD. The AND of the output of the shift resister SRD and the signal SQ8 is entered into the shift resister SRB. The entered address sequences are checked by these shift resisters. When all the entered address sequences coincide, according to the sequences, a write-protection enable signal SQE, a disable signal SQD and a block protection signal SQB are generated as the outputs.

The operation state holding circuit OSHC consists of two latch circuits L1 and L2, and the states of these latch L1 and L2 are defined by the write-protection enable signal SQE, the disable signal SQD and the block protection signal SQB. These states of the latch L1 and L2 hold the mode data to indicate the write-protection operation mode until the next command is entered. The current operation mode is expressed by the output signal WPE of the latch L1 and the output signal WPB of the latch L2. A "High" level of the output signal WPE means that the whole ferroelectric memory FMEM is in the write-protected state. A "High" level of the output signal WPB means that some blocks of the ferroelectric memory FMEM may be in the write-protection state. When the power source is turned on, latch L1 is set by a detecting signal POR from a power-supply voltage detecting circuit VDC shown in FIG. 20, and the protection mode of the ferroelectric memory FMEM goes into an "all bits" protection state, that is, a write inhibit state.

Protection Address Holding Circuit and Write-Protection Circuit

Figure 18:
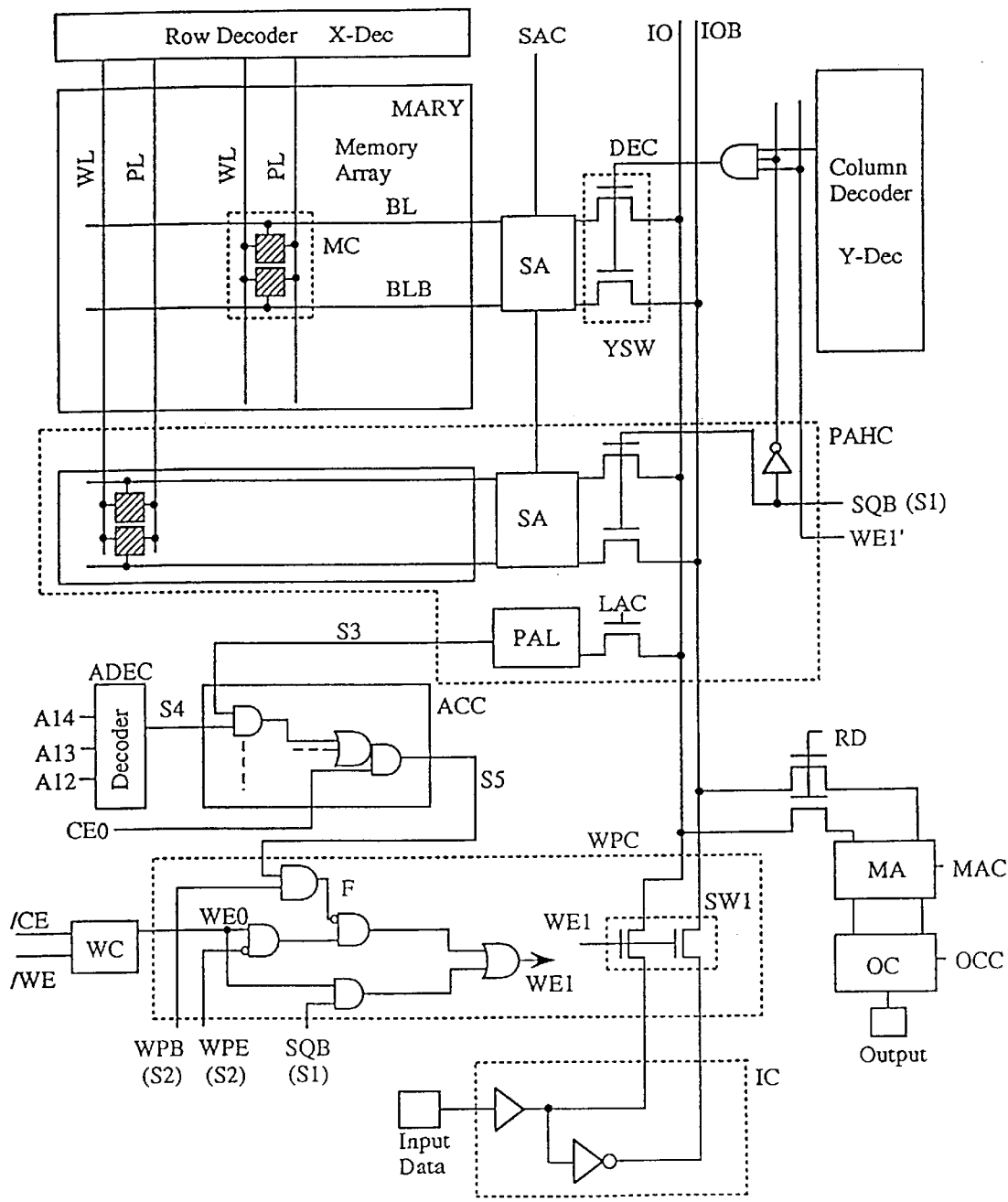
FIG. 18 is another part of the circuit diagram of the write-protection circuit shown in FIG. 16 of the ferroelectric memory of the present invention.

FIG. 18 shows a circuit diagram of the protected address holding circuit PAHC, the address decoder ADEC, the address comparison circuit ACC, the write-protection circuit WPC and so forth. Adding to these circuit diagrams, the common input/output lines IO and IOB, the sense amplifier SA, the memory cell array MARY, the row decoder X-Dec, the column decoder Y-Dec, the main amplifier MA, the output circuit OC and the input circuit IC are shown in FIG. 18. The input/output data of the ferroelectric memory FMEM are of 8-bit configuration so that there are eight common input/output lines IO and IOB, eight main amplifiers MA, eight output circuits OC and eight input circuits IC, respectively. There are also plural memory arrays MARY, and each memory array MARY has plural paired bit lines, and, therefore, the sense amplifier SA and the column switch YSW are connected correspondingly. However, FIG. 18 shows one-bit only to make it simple.

The protection address holding circuit PAHC comprises eight non-volatile memories (ferroelectric memories) and eight latch circuits PAL. The non-volatile memory has a special address within the chip and, at the eighth cycle of the command address sequence of the block protection, the normal row decoder Y-Dec is switched to this address by the signal SQB. When the eighth cycle is the read cycle (in case of the reset sequence of the block protection in FIG. 10), this special address memory cell is accessed and the information in the memory cell is read out, copied and held in latch PAL at the timing of the latch control signal LAC through the common input/output line IO and IOB.

When the eighth cycle of the block protection sequence is the write cycle (in case of the setting sequence of the block protection in FIG. 9), the new data is written in this special address memory cell from the input/output terminal (Input Data) as a normal write cycle does. At the end of this cycle, the same data are written also in the latch PAL by the latch control signal LAC. The written 8-bit data correspond to eight blocks, respectively and "1" ("High" level) means that the corresponding block is to be write protected. After turning the power on, eight latches PAL are set to "High" level and all blocks are write-protected. Therefore, after turning the power on, the reset sequence of the block protection shown in FIG. 10 is required. The eight non-volatile memories (ferroelectric memories) are cleared to "0" at the delivery from the semiconductor manufacturer.

The 8-bit output S3 of the protected address holding circuit PAHC is compared with the output S4 of the address decoder ADEC which decodes 3-bit address A12–A14 by the address comparison circuit ACC and when the agreed address is detected, the 1-bit output result S5 goes to "High" level. The comparison by the address comparison circuit ACC is executed between the decoded output signal S3 of the latch PAL and the decode signal of address (A12–A14) so that it can be executed at high speed.

The write-protection circuit WPC generates a write enable signal WE1, which is the control signal for a switch circuit SW1 to control the writing data input, from an internal write signal WE0, the output S2 (WPE, WPB) of the operation state holding circuit OSHC and the output S1 (SQB) of the command detecting circuit CDC. When the write enable signal WE1 is in "High" level, the switch circuit SW1 is led to conduction state and the input data from the input circuit IC is entered into the common input/output lines IO and IOB.

A write control circuit WC generates the internal write signal WEO based on the chip enable signal /CE and the write enable signal /WE. When both of the chip enable signal /CE and the write enable signal /WE are in "Low" level, the internal write signal WEO goes to "High" level at the timing later than that for the output of the write-protection judgment result F. When the signal WPB and the output S5 of the address comparison circuit ACC are in "High" level, the output signal F goes to "High" level and the internal write signal WE0 is disabled ("Low" level). When the signal WPE is in "High" level, the internal write signal WE0 is disabled also. As a result, the write enable signal WE1 is held in "Low" level. Consequently, the input data to the memory FMEM from outside are cut off at the switch circuit SW1 and the inside of the memory FMEM holds the same state as that of the read operation. Alternatively, the column switch YSW may be controlled instead of the switch circuit SW1 to cut off the input data. That is, when the write enable signal WE1 is connected to WE1', the control signal DEC goes to "Low" level and then the input data may be prohibited from being entered into the memory array. This results in the write-protection against the outside. In this manner, the write-protection is effective while keeping the memory array in the read operation so that the data may be secured by the data re-writing due to the reading operation.

When the eighth cycle of the block protection sequence is the write cycle, the signal SQB goes to "High" level and the write enable signal WE1 goes to "High" level also. When the signal SQB goes to "High" level, the non-volatile memory cell of the protected address holding circuit PAHC is connected to the common input/output lines IO and IOB, and then the writing is enabled.

The command detecting circuit CDC and the operation state holding circuit OSHC are arranged on the top of the chip (upper side of the memory array MARY0, MARY4) shown in the layout drawing illustrated in FIG. 5. The protected address holding circuit PAHC, the address decoder ADEC, the address comparison circuit ACC and the write-protection circuit WPC are arranged on the bottom of the chip (lower side of the memory array MARY3, MARY8) shown in the layout drawing illustrated in FIG. 5. The non-volatile memory of the protected address holding circuit PAHC is arranged inside of the array (MARY0, MARY1, MARY2, MARY3, MARY4, MARY5, MARY6, MARY7). This is because the normal memory array and the row decoder X-Dec and the like can be used in common.

The latch PAL of the protected address holding circuit PAHC, the address comparison circuit ACC and the address decoder ADEC are arranged on the bottom of the chip so that the judgment whether the accessed address is in the write-protected address area or not can be executed in minimum delay time.

The data input/output terminals (I/O0–I/O7) are arranged also on the bottom of the chip so that the main amplifier AM and the output circuit OC are arranged on the bottom of the chip. The common input/output lines IO,IOB are arranged on the bottom of the chip so that, when the latch PAL is arranged on the bottom of the chip, the number of wirings can be reduced when compared with the case where the latch PAL is arranged on the top of the chip. On the contrary, when the common input/output lines IO,IOB are arranged on the top, the number of wirings may be increased because there are many address wirings on the top. There is free space around the address terminals (A0, A1, A2) because such larger circuits as the main amplifier MA or the output circuit OC are not located there. The latch PAL of the protected address holding circuit PAHC, the address comparison circuit ACC and the address decoder ADEC are arranged there, so that the write-protection function can be added with a minimized area requirement on the chip.

Figure 19:
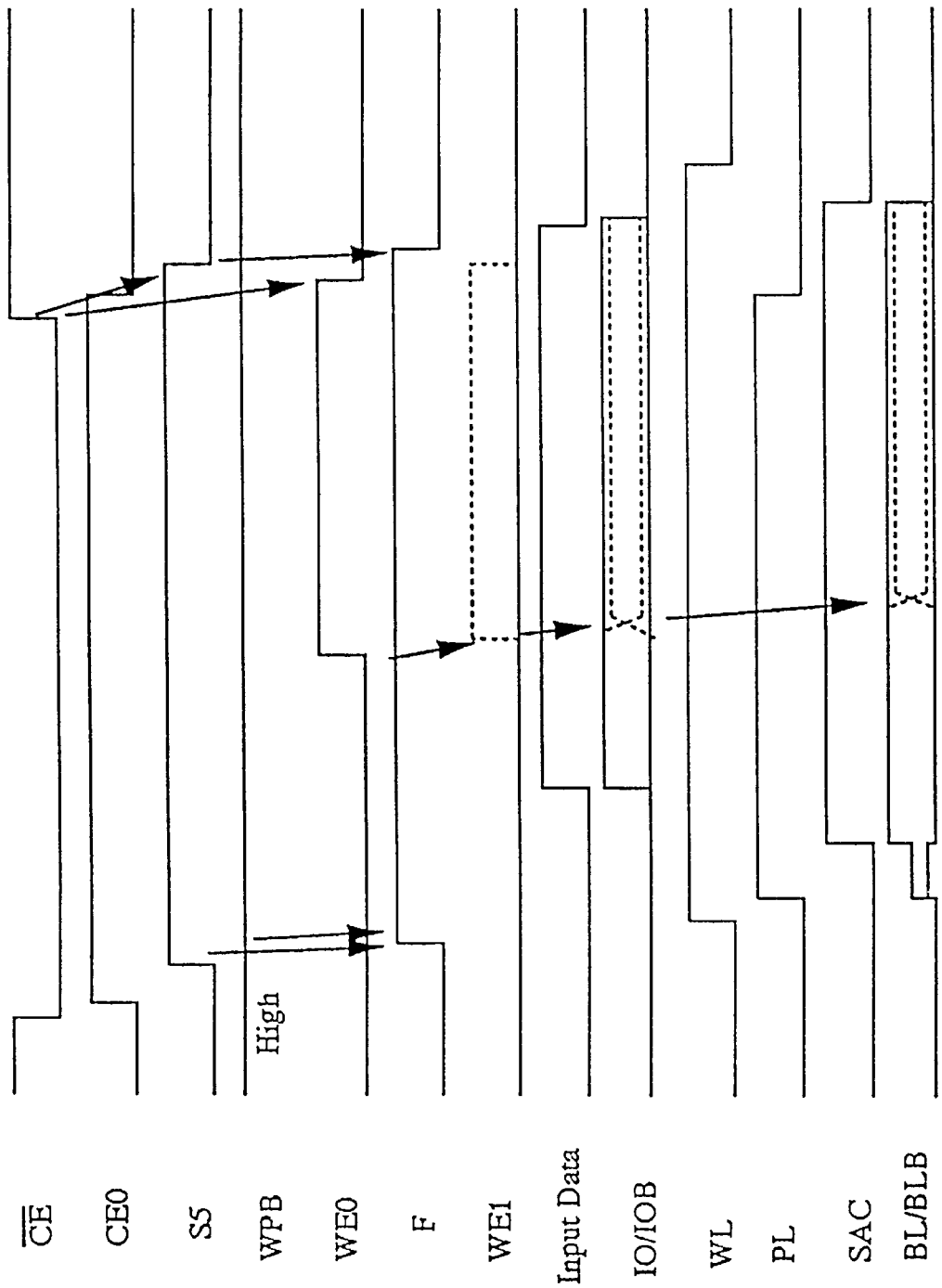
FIG. 19 is a timing diagram for the write-protection circuit of FIGS. 16 to 18 of the ferroelectric memory of the present invention.

FIG. 19 shows the wave-form of each signal shown in FIG. 18 when the write cycle runs on a block with block protection.

When the chip enable signal /CE goes to "Low" level, the internal chip enable signal CEO goes to "High" level. As a result, the output S5 of the address comparison circuit ACC becomes effective (goes to "High" level). The signal WPB is fixed in "High" level because of the block protection state. Therefore, when the output S5 of the address comparison circuit ACC goes to "High" level, the signal F transits from "Low" level to "High" level. Consequently, when the internal write signal WE0 goes to "High" level, the write enable signal WE1 still remains in "Low" level. The dotted lines show the timing wave-forms of the write enable signal WE1, of the common input/output lines IO,IOB, and of the bit lines BL, BLB. FIG. 19 also illustrates other wave-forms showing that the signals may change at those timings when the signal F is in "Low" level.

On the other hand, when the word line WL and the plate line PL selected by the row decoder X-Dec are in "High" level, the contents of the memory cells MC (stored data) are read into the bit line BL, BLB. The sense amplifier control signal SA goes to "High" level and the signal of the bit line BL, BLB is amplified by the sense amplifier SA. At that time, the contents of the memory cell MC are destroyed. However, the data are re-written by the sense amplifier SA. When the plate line PL is in "High" level, the data are re-written in one of the ferroelectric capacitors, and when the plate line PL is in "Low" level, the data are re-written in the other ferroelectric capacitor.

The write enable signal WE1 is in "High" level, so that the input data are prohibited from being entered to the common input/output line IO, IOB by the switch SW1. Therefore, the common input/output line IO, IOB holds the level read out from the memory array MARY.

When the chip enable signal /CE goes to "High" level, the internal chip enable signal CEO goes to "Low" level. As a result, the output S5 of the address comparison circuit ACC becomes ineffective (goes to "Low" level). The internal write signal WE0 also goes to "Low" level. Therefore, when the output S5 of the address comparison circuit ACC goes to "Low" level, the signal F also goes to "Low" level.

Power-Supply Voltage Detecting Circuit

Figure 20:
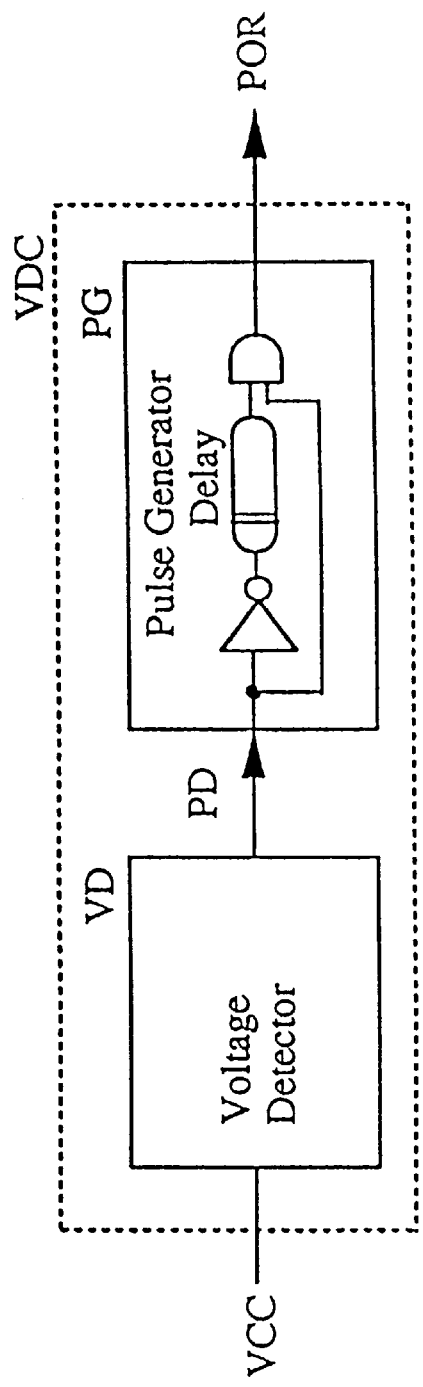
FIG. 20 is a circuit diagram of a power-supply voltage detecting circuit of the ferroelectric memory of the present invention.
Figure 21:
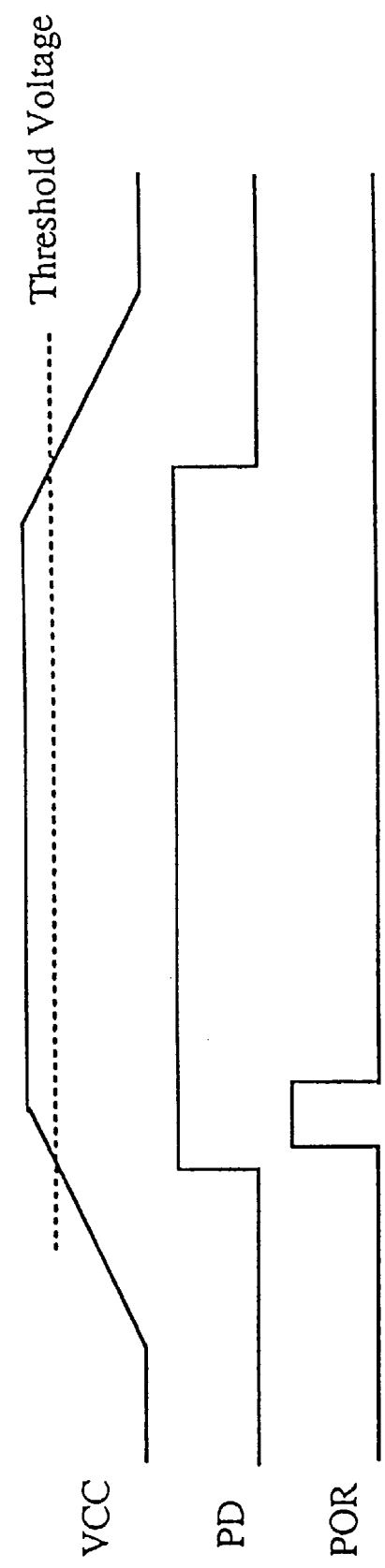
FIG. 21 is a diagram to show a timing wave-form of the power-supply voltage detecting circuit in FIG. 20.

FIG. 20 shows an embodiment of the power-supply voltage detecting circuit. The power-supply voltage detecting circuit VDC comprises a voltage detecting circuit VC and a pulse generating circuit PG. When the power-supply voltage is higher than the threshold voltage, the voltage detecting circuit VC sets the signal PD to "High" level. The pulse generating circuit PG comprises an inverter circuit, a delay circuit and an AND circuit. As shown in FIG. 21, when the signal PD transits from "Low" level to "High" level, generates a pulse POR of constant amplitude. That is, the power-supply voltage detecting circuit is a circuit to detect the application of power from the power supply.

Alternative Embodiment

Figure 22:
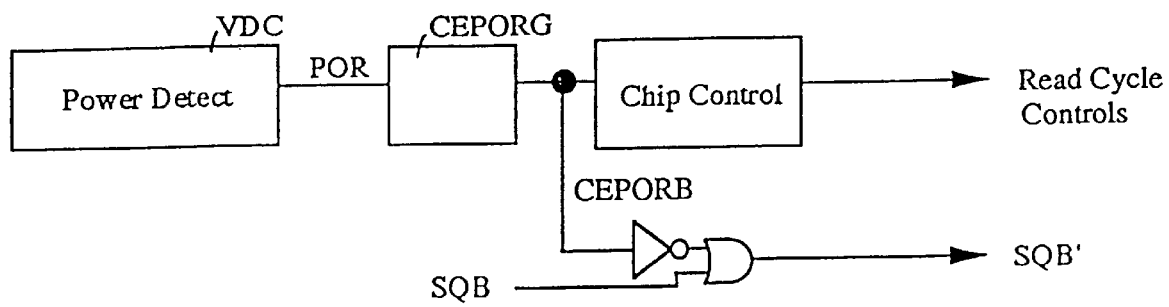
FIG. 22 is a circuit diagram of a modified write-protection circuit of the ferroelectric memory of the present invention.

FIG. 22 shows another circuit diagram of an alternative embodiment of a write-protection circuit of the ferroelectric memory of the present invention. This circuit allows setting the block protection data from the non-volatile memory of the protected address holding circuit PAHC to the latch PAL without executing the reset sequence of the block write protection after turning the power on. That is, this circuit allows automatically running the eighth read cycle in the reset sequence for the block write protection within the ferroelectric memory FMEM after turning the power on.

Figure 23:
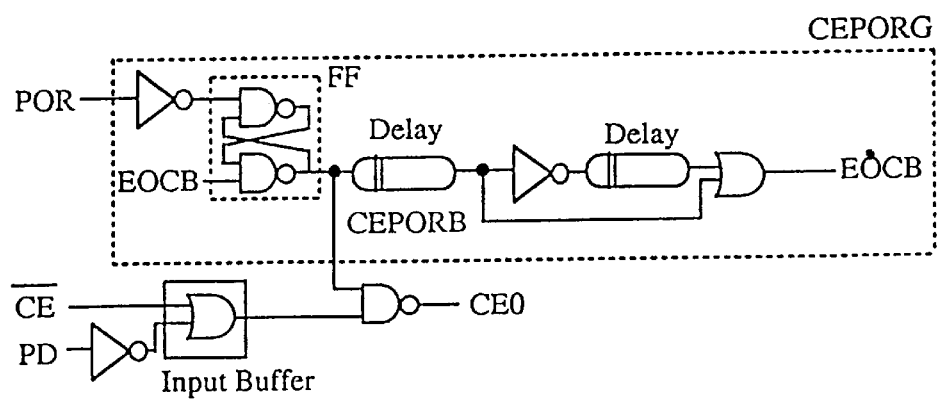
FIG. 23 is a circuit diagram of an artificial internal chip enable generation circuit in FIG. 22.
Figure 24:
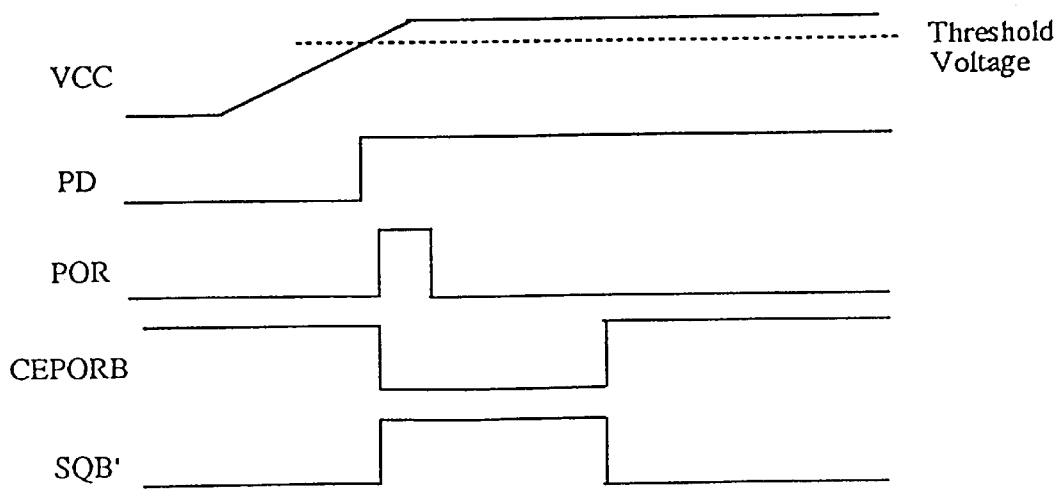
FIG. 24 is a diagram to show a timing wave-form of the circuit diagrams in FIGS. 22 and 23.

The power-supply voltage detecting circuit VDC is the same as that shown in FIG. 20. The pseudo internal chip enable generating circuit CEPORG receives the pulse signal POR indicative of the application of power, and then generates the signal CEPORB to generate the internal chip enable signal CEO. As shown in FIG. 23 and FIG. 24, when the pulse signal POR goes to "High" level, the flip-flop FF is set and the signal CEPORB goes to "Low" level. Two delay circuits, the inverter circuit and the OR circuit, form the trailing edge detecting circuit to detect the transition of the signal CEPORB from "High" level to "Low" level, and this trailing edge detecting circuit generates the pulse signal EOCB delayed by the designated time interval. When the pulse signal EOCB goes to "Low" level, the flip-flop FF is reset and the signal CEPORB goes to "High" level. The chip enable signal /CE and the inverted signal of the output PD of the power-supply voltage detecting circuit are entered into the OR circuit, and the output signal of the OR circuit and the signal CEPORB are entered into the NAND circuit. Then, the internal chip enable signal CEO is generated.

The signal CEPORB is entered into the chip control circuit shown in FIG. 22 and generates the pseudo control signal necessary for the read cycle. That is, the address and the control signal required to read the non-volatile memory of the protected address holding circuit PAHC shown in FIG. 18 are generated. The inverted signal of the signal CERORB is ORed with the signal SQB shown in FIG. 17 and the signal SQB' is generated. The signal SQB' is used in place of the signal SQB shown in FIG. 18.

Consequently, the block write-protection can be reset without executing the reset sequence for the block write-protection from outside after turning the power on, so that the ferroelectric memory becomes easy to use.

In this embodiment, write-protection is achieved by disabling the write enable signal /WE within the chip. During the series of processes for the selection of the memory array; the first transition of the word line WL; and the amplification of the signal of the bit line BL, BLB; the write cycle with write-protection is executed the same as if the read cycle is performed. Therefore, the write-protection control can be executed after the first transition of the word line PL. As a result, the write-protection control can be implemented even at the timing specified in FIG. 4 without reducing the execution rates of the write cycle in the write-protected area.

In this embodiment, the protected address holding circuit PAHC comprises the non-volatile memory and the latch PAL. When the new write-protected block is set, the new protection data are written in both of the non-volatile memory and the latch PAL in the same write cycle. Therefore, the checking whether the accessed address is in the write-protected area or not is executed by comparing the output of the latch PAL with the decoded result of the high-order address corresponding to the write-protected block without reading the stored information in the non-volatile memory, resulting in shorter judgment time than that for all address decoding. Furthermore, the non-volatile memory can be added as a part of the memory array MARY, so that the new protected address can be set in the same procedure as that of the normal write cycle and the setting information of the write-protected area can be non-volatile.

In general, the information in the non-volatile memory is required to be entered into the latch PAL after turning the power on, but, in this embodiment, the address information of the write-protected area can be set automatically to the latch PAL after turning the power on by the internal address switching at the eighth cycle of the block protection sequence so as to make it similar to the read cycle from the non-volatile memory.

Therefore, the memory of RAM/ROM in the discrete memory with a variable write-protected area is provided, which enables high speed writing equivalent to that of a general purpose discrete SRAM or a pseudo SRAM.

Up to this point the inventions of the present invention are described based on some preferred embodiments, but it is to be understood that no limitation with respect to the embodiments referred herein is intended and that numerous variations and modifications may be effected without departing from the spirit and scope of the invention. For instance, the memory cell may not be of the 2T2C configuration but of the 1T1C configuration similar to that of the dynamic RAM. When memory cells of the 1T1C configuration are used, the capacity may be enlarged the same as that of a typical general purpose DRAM. In the embodiment mentioned above, the write-protected block is designated in one-to-one correspondence with each datum entered from the data input/output I/O, but it may be designated corresponding to the decoded datum entered from the data input/output I/O. This procedure allows the designation of the divided blocks even if the number of the divided blocks is more than that of the data input/output I/O. In the embodiment described in previous section, the protection sequence is completed by the execution of the read cycle of the designated address combination, but, alternatively, the protection mode may start by three repetitions (3-bytes) of the input of the combination of designated address and data, and may end by six repetitions (6-bytes) of the input of the combination of designated address and data the same as that for the EPROM of the conventional technology 1. In this case, an input terminal is added and, if the terminal is in the default state, new block protection is set next to the cancel sequence or the block protection is reset. In that case, the pin arrangement is also matched with that for the EEPROM.

We claim:

1. A semiconductor memory device, comprising:
   a ferroelectric memory array comprising a plurality of memory blocks, each of which has a plurality of memory cells having ferroelectric capacitances;
   a first circuit which stores information of write protection corresponding to each of said memory blocks; and
   a second circuit which sets said information of write protection in said first circuit at a write cycle of said memory array after predetermined read cycles of said memory array.

2. A semiconductor memory device according to claim 1, wherein after seven read cycles are executed to predetermined addresses of said memory array, said information of write protection is set in said first circuit by a write cycle execution to a predetermined address of said first circuit in an eighth cycle.

3. A semiconductor memory device according to claim 2, wherein said information of write protection stored in said first circuit corresponds to input data in said write cycle.

4. A semiconductor memory device according to claim 3, wherein said first circuit includes ferroelectric capacitances for storing said information of write protection.

5. A semiconductor memory device, comprising:
   a ferroelectric memory array comprising a plurality of memory blocks, each of which has a plurality of memory cells having ferroelectric capacitances;
   a first circuit which stores information of write protection corresponding to each of said memory blocks; and a latch circuit which stores said information of write protection read out from said first circuit.

6. A semiconductor memory device according to claim 5, wherein after two or more read cycles are executed to predetermined addresses of the memory array, said information of write protection is set in said latch circuit during a write cycle execution to a predetermined address of the first circuit array.

7. A semiconductor memory device according to claim 5, wherein after seven read cycles are executed to predetermined addresses of said memory array, said information of write protection is set to said latch circuit during a write cycle execution to a predetermined address of the first circuit in an eighth cycle.

8. A semiconductor memory device according to claim 7, wherein said first circuit includes ferroelectric capacitance for storing said information of write protection.

9. A semiconductor memory device, comprising:

a ferroelectric memory array comprising a plurality of memory blocks, each of which has a plurality of memory cells having ferroelectric capacitances; and a circuit which stores information of write protection corresponding to each of said memory blocks, wherein a write-protection enable to provide write protection of the memory array is set by input of two or more groups of predetermined addresses from outside of said semiconductor memory device.

10. A semiconductor memory device according to claim 9, wherein said write-protection is cancelled by input of two or more groups of predetermined addresses from outside of said semiconductor memory device.

* * * * *